(12) United States Patent
Lee et al.

(10) Patent No.: US 7,560,332 B2
(45) Date of Patent: Jul. 14, 2009

(54) INTEGRATED CIRCUIT CAPACITOR STRUCTURE

(75) Inventors: Kyoung-Woo Lee, Seoul (KR);
Wan-Jae Park, Kyungki-do (KR);
Jeong-Hoon Ahn, Seoul (KR);
Kyung-Tae Lee, Kyungki-do (KR);
Mu-Kyeng Jung, Kyungki-do (KR);
Yong-Jun Lee, Kyungki-do (KR);
Il-Goo Kim, Kyungki-do (KR);
Soo-Geun Lee, Kyungki-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 113 days.

(21) Appl. No.: 11/733,711

(22) Filed: Apr. 10, 2007

(65) Prior Publication Data
US 2007/0184610 A1    Aug. 9, 2007

Related U.S. Application Data

(62) Division of application No. 10/688,077, filed on Oct. 16, 2003, now Pat. No. 7,229,875.

(30) Foreign Application Priority Data

Oct. 17, 2002   (KR)   ............................. 2002-63477
Jan. 17, 2003   (KR)   ............................. 2003-3296

(51) Int. Cl.
*H01L 21/8234*   (2006.01)

(52) U.S. Cl. ..................... 438/238; 438/250; 438/253; 438/393; 257/E21.008

(58) Field of Classification Search ......... 438/238–240, 438/250, 253, 256, 381, 393, 396, 637, 672, 438/957; 257/E21.008
See application file for complete search history.

(56) References Cited

U.S. PATENT DOCUMENTS 5,194,932 A    3/1993    Kurisu
5,208,726 A    5/1993    Apel (Continued)

FOREIGN PATENT DOCUMENTS

EP    1119027 A2    7/2001

(Continued)

OTHER PUBLICATIONS

English language abstract of Korea Publication No. 2001-0003343.

(Continued)

*Primary Examiner*—Kevin M Picardat
(74) *Attorney, Agent, or Firm*—Marger Johnson & McCollom, P.C.

(57) ABSTRACT

Embodiments of the invention include a MIM capacitor that has a high capacitance that can be manufactured without the problems that affected the prior art. Such a capacitor includes an upper electrode, a lower electrode, and a dielectric layer that is intermediate the upper and the lower electrodes. A first voltage can be applied to the upper electrode and a second voltage, which is different from the first voltage, can be applied to the lower electrode. A wire layer, through which the first voltage is applied to the upper electrode, is located in the same level as or in a lower level than the lower electrode.

14 Claims, 17 Drawing Sheets

U.S. PATENT DOCUMENTS

| | | | |
|---|---|---|---|
| 5,563,762 | A | 10/1996 | Leung et al. |
| 5,583,359 | A | 12/1996 | Ng et al. |
| 5,879,985 | A | 3/1999 | Gambino et al. |
| 5,926,359 | A * | 7/1999 | Greco et al. ......... 257/E21.008 |
| 6,034,411 | A | 3/2000 | Wade et al. |
| 6,064,108 | A | 5/2000 | Martinez |
| 6,180,976 | B1 | 1/2001 | Roy |
| 6,184,567 | B1 | 2/2001 | Fujisawa et al. |
| 6,365,954 | B1 | 4/2002 | Dasgupta |
| 6,479,391 | B2 * | 11/2002 | Morrow et al. .............. 438/706 |
| 6,534,374 | B2 | 3/2003 | Johnson et al. |
| 6,710,425 | B2 | 3/2004 | Bothra et al. |
| 6,756,282 | B2 | 6/2004 | Nagano et al. |
| 6,784,478 | B2 | 8/2004 | Merchant et al. |
| 6,800,923 | B1 | 10/2004 | Yamamoto et al. |
| 6,881,996 | B2 | 4/2005 | Chen et al. |
| 6,989,313 | B2 | 1/2006 | Park |
| 2005/0063135 | A1 | 3/2005 | Borland et al. |

FOREIGN PATENT DOCUMENTS

| | | |
|---|---|---|
| EP | 1182708 A2 | 2/2002 |
| JP | 63-239970 | 10/1988 |
| KR | 2001-0003343 | 1/2001 |

OTHER PUBLICATIONS

English language abstract of Japanese Publication No. 63-239970.

M. Armacost, et al "A High Reliability Metal Insulator Metal Capacitor for 0.18 μm Copper Technology", IBM Semiconductor Research and Development Center, Hopewell Junction, NY, USA 12533, IEEE 2000, pp. 157-160.

Ruichen Liu, et al., "Single Mask Metal-Insulator-Metal (MIM) Capacitor With Copper Damascene Metallization For Sub-0.18 μm Mixed Mode Signal and System-on-a-Chip (SoC) Applications", IEEE 2000, pp. 111-113.

* cited by examiner

INTEGRATED CIRCUIT CAPACITOR STRUCTURE

CROSS REFERENCE TO RELATED APPLICATIONS

This application is a divisional of U.S. patent application Ser. No. 10/688,077, filed Oct. 16, 2003, issued Jun. 12, 2007, U.S. Pat. No. 7,229,875, which claims priority from Korean Patent Application Nos. 2002-63477 and 2003-3296, filed Oct. 17, 2002 and Jan. 17, 2003, in the Korean Intellectual Property Office, which is related to U.S. patent application Ser. No. 10/678,531, issued Dec. 26, 2006, U.S. Pat. No. 7,154,162, the disclosures of which are incorporated herein in their entireties by reference.

TECHNICAL FIELD

The present invention relates to an integrated circuit capacitor and, more specifically, to a metal-insulator-metal (MIM) capacitor structure and a manufacturing method thereof. Such a structure is particularly advantageous to use in logic, analog, or circuits that include both Dynamic Random Access Memory (DRAM) and Merged DRAM and Logic (MDL) devices.

BACKGROUND

Several types of integrated circuit capacitors exist, which are classified according to their junction structures, such as metal-oxide-silicon (MOS) capacitors, pn junction capacitors, polysilicon-insulator-polysilicon (PIP) capacitors, and metal-insulator-metal (MIM) capacitors. In all of the above-listed capacitors except for MIM capacitors, at least one electrode is formed of monocrystalline silicon or polycrystalline silicon. However, physical characteristics of monocrystalline and polycrystalline silicon limit minimizing the amount of resistance of a capacitor electrode. In addition, when a bias voltage is applied to a monocrystalline or polycrystalline silicon electrode, depletion may occur, which can cause the applied voltage to become unstable. When this occurs, the capacitance of the silicon electrode cannot be maintained at a certain level.

Using MIM capacitors has been proposed to address the varying capacitance problem, since capacitance of MIM capacitors does not depend on a bias voltage or temperature. MIM capacitors have a lower voltage coefficient of capacitance (VCC) and a lower temperature coefficient of capacitance (TCC) than other capacitor types. The VCC indicates variation of capacitance according to the changes in voltage and the TCC indicates variation of capacitance according to the changes in temperature. Because of having a low VCC and TCC, MIM capacitors have been particularly useful for fabricating analog products. More recently, MIM capacitors have been used to make mixed mode signal products and system-on-a-chip (SOC) products. For example, MIM capacitors have been widely employed in analog capacitors and filters for analog or mixed mode signal applications in wired or wireless communications, as decoupling capacitors for main processing unit boards, as high frequency radio-frequency (RF) capacitors, and in embedded DRAMs.

FIGS. 1 and 2 are cross-sectional diagrams of two conventional MIM capacitors as taught by R. Liu et al., Proc. IITC, 111 (2000) and M. Armacost et al., Proc. IEDM, 157 (2000), respectively. Reference numerals 10 and 12 indicate MIM capacitors, and reference numerals 20, 30, 40, and 50 indicate a lower electrode, a dielectric layer, an upper electrode, and a capping layer, respectively. In addition, reference numerals C/P_20, C/P_40, C/H, D/D_20, D/D_40, and D/R indicate a lower electrode contact plug, an upper electrode contact plug, contact holes, a dual damascene wiring layer contacting a lower electrode, a dual damascene wiring layer contacting an upper electrode, and damascene regions, respectively. Other parts of the MIM capacitors 10 and 12 correspond to interlayer or other dielectric layers.

In the MIM capacitor 10 shown in FIG. 1, the lower electrode 20 is electrically connected to a wiring layer (not shown) by the lower electrode contact plug C/P_20 and the upper electrode 40 is electrically connected to another wiring layer (not shown) by the upper electrode contact plug C/P_40. The lower electrode contact plug C/P_20 and the upper electrode contact plug C/P_40 are formed in their respective contact holes C/H having a high aspect ratio but different depths. Specifically, the C/H for the C/P_20 runs deeper than the C/H for the C/P_40, because the C/P 20 contacts the lower electrode 20. When forming the contact hole C/H, it is difficult to precisely control an etching process so as to stop the etching of C/H at the top surface of the upper electrode 40 and at the top surface of the lower electrode 20 simultaneously. Therefore, the upper electrode 40 must be formed to have a predetermined thickness so that it can endure an excessive etching process. However, as the thickness of the upper electrode 40 increases, the dielectric layer 30 under the upper electrode 40 is more likely to be exposed to an excessive etching process for patterning the upper electrode 40, and thus the lower electrode 20 may be exposed due to the dielectric layer 30, which is etched away. Therefore, the dielectric layer 30 must also be formed to have a predetermined thickness so that it can endure an excessive etching process, and this results in a decrease in the capacitance of the entire capacitor 10.

In the MIM capacitor 12 shown in FIG. 2, the dual damascene wiring layer D/D_20 and the dual damascene wiring layer D/D_40 are electrically connected to the lower electrode 20 and the upper electrode 40, respectively. They are formed in their respective damascene regions D/R having a high aspect ratio but different depths. In order to obtain a sufficient margin for an etching process for forming the dual damascene region D/R, in which the dual damascene wiring layer D/D_40 is supposed to be formed, the thickness of the upper electrode 40 and the thickness of the dielectric layer 30 must be increased, which accompanies the decrease in the capacitance of the entire capacitor 12.

In addition, there is a high probability of having a bad electrical contact occur due to byproducts, like polymer, generated during the formation of the contact holes C/H and the damascene regions D/R because they have a high aspect ratio. In other words, the manufacturing process of conventional MIM capacitors results in many disadvantages including limiting the capacitance of a capacitor.

Embodiments of the invention address this and other limitations in the prior art.

BRIEF DESCRIPTION OF THE DRAWINGS

The invention will be understood more fully from the detailed description given below and from the accompanying drawings of particular embodiments of the invention, which, however, should not be taken to limit the invention to the specific embodiments, but are to facilitate explanation and understanding.

DETAILED DESCRIPTION OF THE INVENTION

In the following detailed descriptions, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Embodiments of the invention include a MIM capacitor that has a high capacitance that can be manufactured without the problems that affected the prior art. Such a capacitor includes an upper electrode, a lower electrode, and a dielectric layer that is intermediate the upper and the lower electrodes. A first voltage can be applied to the upper electrode and a second voltage, which is different from the first voltage, can be applied to the lower electrode. A wire layer, through which the first voltage is applied to the upper electrode, is located in the same level as or in a lower level than the lower electrode.

Figure 3:
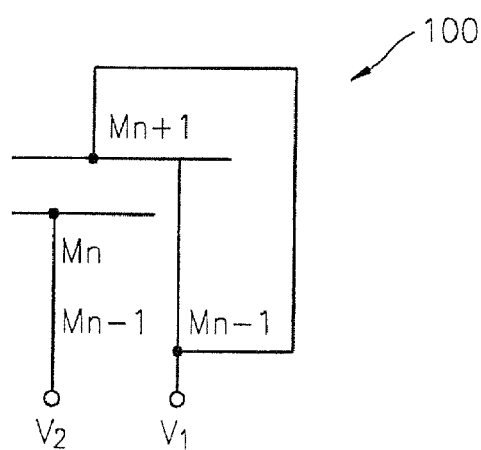
FIG. 3 is an equivalent schematic circuit diagram of an MIM capacitor according to an embodiment of the present invention.

FIG. 3 is an equivalent circuit diagram of an MIM capacitor 100 according to an embodiment of the present invention. The MIM capacitor 100 includes a lower electrode in an Mn level and an upper electrode in an Mn+1 level. A first voltage V1 is applied to the upper electrode in the Mn+1 level via a wire layer in an Mn−1 level, which is lower than the Mn level. A second voltage V2 is applied to the lower electrode in the Mn level via a wire layer in the Mn−1 level. In this disclosure, Mn−1 to Mn+1 represent the levels of n−1th to n+1th wire layers, n being an integer. Depending on the application, the levels of wire layers may vary, and the positions of upper and lower electrodes and wire layers may also vary.

Figure 4:
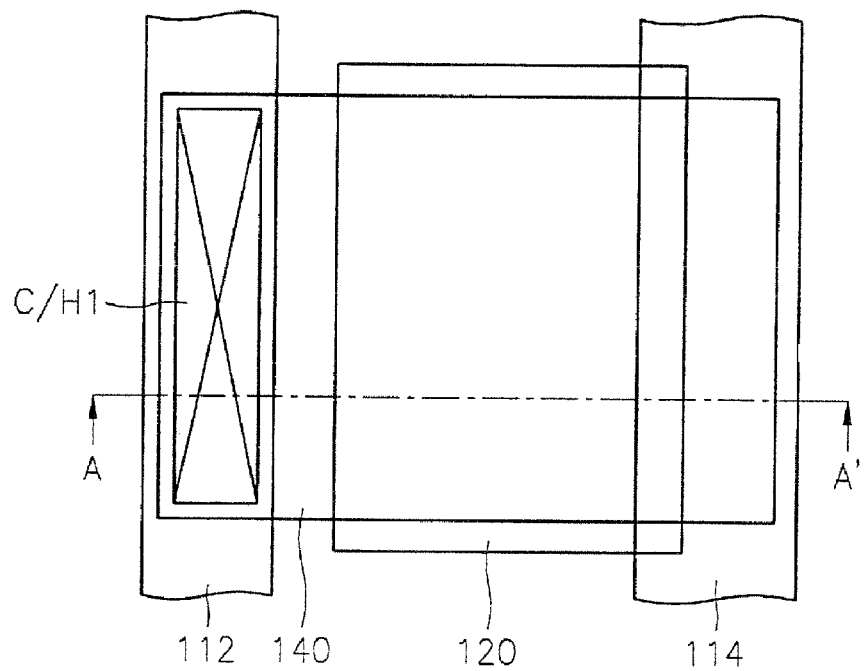
FIG. 4 is an example layout diagram for forming the MIM capacitor according to the schematic diagram of FIG. 3.

The MIM capacitor 100 shown in FIG. 3 may be embodied using a layout such as that shown in FIG. 4. Reference numerals 112, 114, 120, 140, and C/H1 represent a pattern for a first wire layer, a pattern for a second wire layer, a pattern for a lower electrode, a pattern for an upper electrode, and a pattern for a contact hole which exposes the first wire layer, respectively. A first voltage V1 is applied to the first wire layer 112, and a second voltage V2 is applied to the second wire layer 114.

Figure 5:
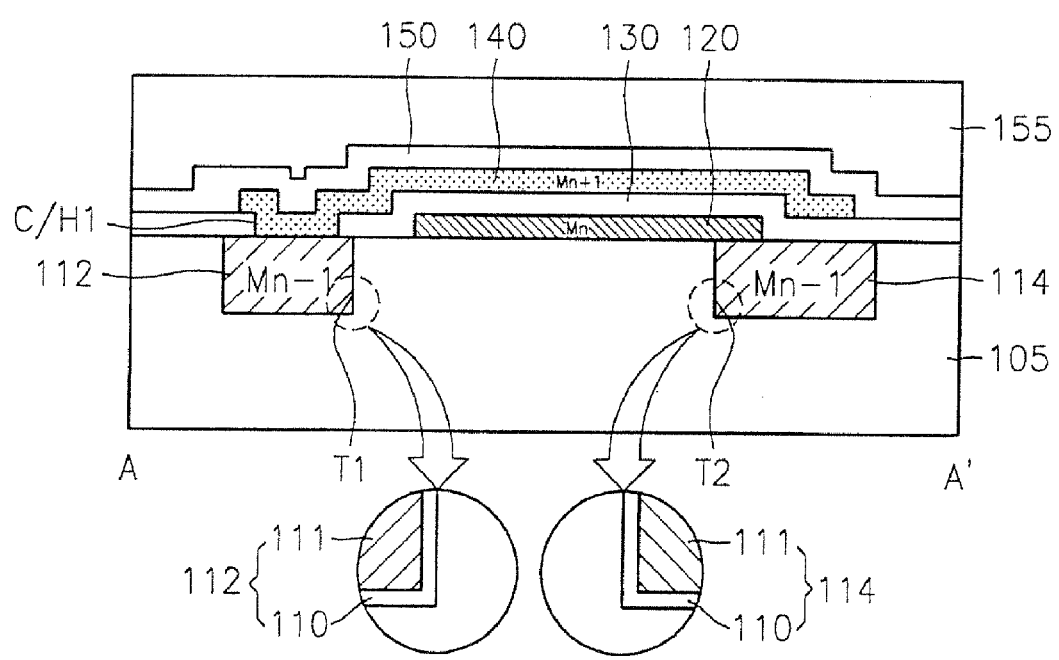
FIGS. 5-7 are cross-sectional diagrams of MIM capacitors formed according to the layout illustrated in FIG. 4.
Figure 6:
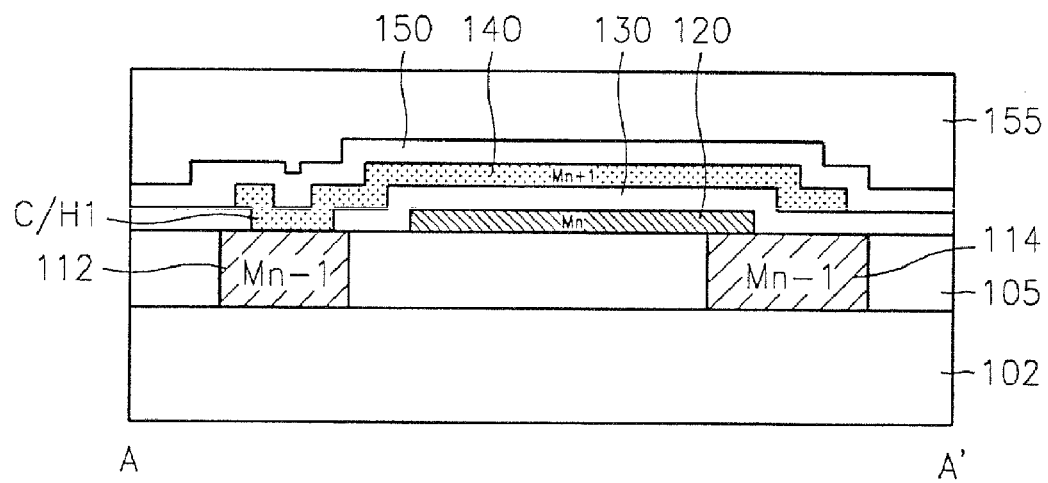
Figure 7:
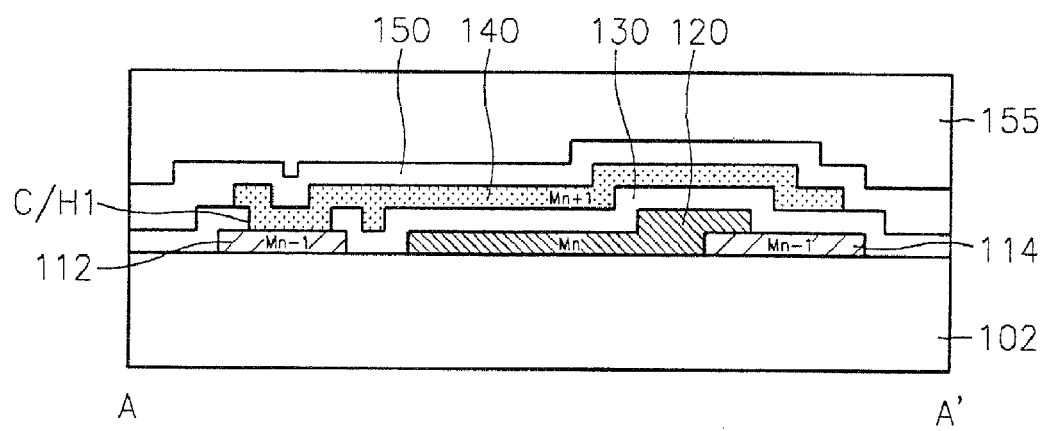

MIM capacitors formed using the layout diagram shown in FIG. 4 may have different cross-sectional shapes as shown in FIGS. 5 through 7, taken along the line A-A'. Referring to FIG. 5, an MIM capacitor has a structure in which an upper electrode 140 is arranged to overlap a lower electrode 120, and a dielectric layer 130 is intermediate the upper and the lower electrodes 140 and 120. The upper electrode 140 is formed of a conductive layer in the Mn+1 level, and the first wire layer 112 is formed of a conductive layer in the Mn−1 level. The upper electrode 140 contacts the first wire layer 112, to which the first voltage V1 is applied, through the contact hole C/H1 which is formed in the dielectric layer 130. The lower electrode 120 is formed of a conductive layer in the Mn level and directly contacts the second wire layer 114, without using a contact hole. The second voltage V2 is applied to the second wire 114.

Figure 1:
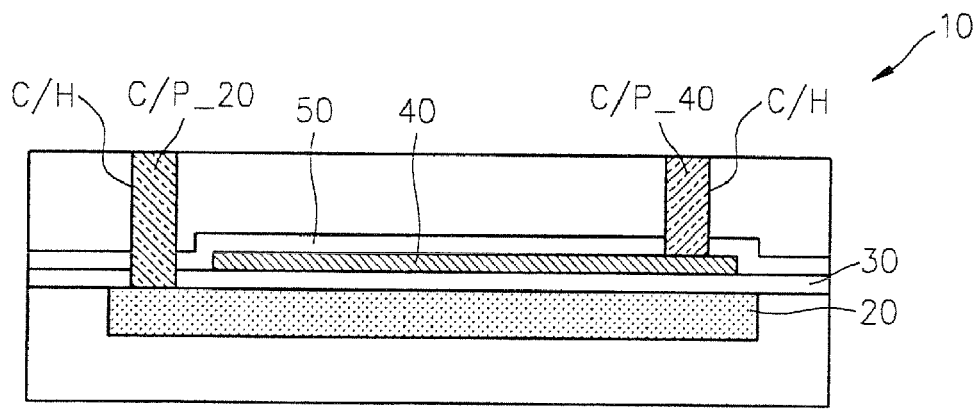
FIGS. 1 and 2 are cross-sectional diagrams of conventional MIM capacitors.
Figure 2:
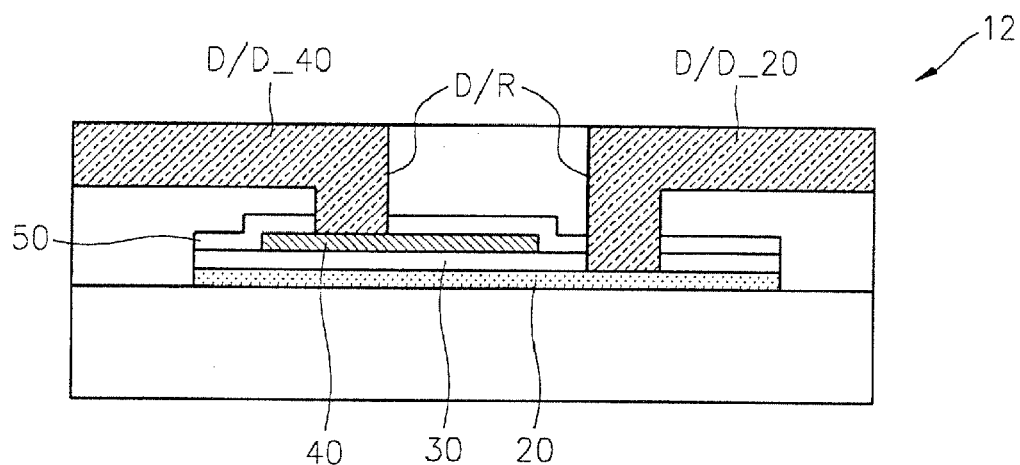

The second wire layer 114 is formed of a conductive layer in the same level as the first wire layer 112. The contact hole C/H1 is formed to expose the surface of the first wire layer 112 before the upper electrode 140 is formed. Therefore, the contact hole C/H1 is completely different from the contact hole C/H in the conventional MIM capacitor 10 shown in FIG. 1 because the contact hole C/H is formed to expose the top surface of the upper electrode 40.

According to embodiments of the present invention, the upper electrode and a dielectric layer do not need to be formed as thick as they formerly were in the conventional techniques. In other words, it is possible to minimize the thickness of the dielectric layer and to still form an MIM capacitor that has a high capacitance. In addition, since the thickness of the dielectric layer 130, in which the contact hole C/H1 is formed, is very small, the aspect ratio of the contact hole C/H1 is also very small. Accordingly, the problems accompanied by the contact holes C/H of FIG. 1, which have a high aspect ratio, are much less likely to occur in the present embodiment.

As shown in FIG. 5, it is preferable that the first and the second wire layers 112 and 114 are formed in a damascene wiring layer embedded in an interlayer dielectric layer 105 so as to have a planarized top surface to minimize a step difference. The damascene wiring layer is formed by depositing a conductive layer in trenches T1 and T2 formed in the interlayer dielectric layer 105 and by performing chemical mechanical polishing (CMP). The damascene wiring layer may include a barrier metal layer 110 formed at the inner sidewalls and the bottom surface of each of the trenches T1 and T2 and a conductive layer 111 filling the trenches T1 and T2.

The upper electrode 140 is covered with an upper interlayer dielectric layer so that it can be insulated from an upper structure (not shown). The upper interlayer dielectric layer is preferably a capping layer 150 for protecting the upper electrode 140 and an interlayer dielectric layer 155.

Connections between the first and second wire layers 112 and 114 and other wire layers and processes of manufacturing wire layers in a level higher than the Mn+1 level may vary depending on the application.

The sizes of the upper and lower electrodes 140 and 120 may also vary depending on the application, preferably, to maximize the effective area of a capacitor electrode, i.e., the surface area of the upper and lower electrodes 140 and 120 facing each other.

In FIG. 6, unlike in the structure shown in FIG. 5 where the first and second wire layers 112 and 114 are formed by performing CMP on conductive layers, the first and second wire layers 112 and 114 are formed by performing CMP on an interlayer dielectric layer 105. In other words, a conductive layer is formed on a lower interlayer dielectric layer 102 and is patterned using a conventional photolithography process, thus forming patterns for the first and second wire layers 112 and 114. Next, the interlayer dielectric layer 105 is deposited on the lower interlayer dielectric layer 102, and a CMP process is performed on the interlayer dielectric layer 105 so that it can be level with the top surfaces of the patterns for the first and second wire layers 112 and 114. Other elements of the MIM capacitor shown in FIG. 6 and their structures are the same as the corresponding elements of the MIM capacitor shown in FIG. 5 and their structures.

Referring to FIG. 7, the first and the second wire layers 112 and 114 are very thin and thus do not need to be planarized by performing CMP. In particular, the first and the second wire layers 112 and 114 are wiring patterns formed on a lower interlayer dielectric layer 102 by patterning. A lower electrode 120 is patterned so as to be isolated from the first wire layer 112 but to directly contact the second wire layer 114. The isolation of the first wire layer 112 from the lower electrode 120 is accomplished by forming a dielectric layer 130 as illustrated. Other elements of the MIM capacitor shown in FIG. 7 and their structures are the same as the corresponding elements of the MIM capacitor shown in FIG. 5 and their structures, and will therefore not be discussed further.

Figure 8:
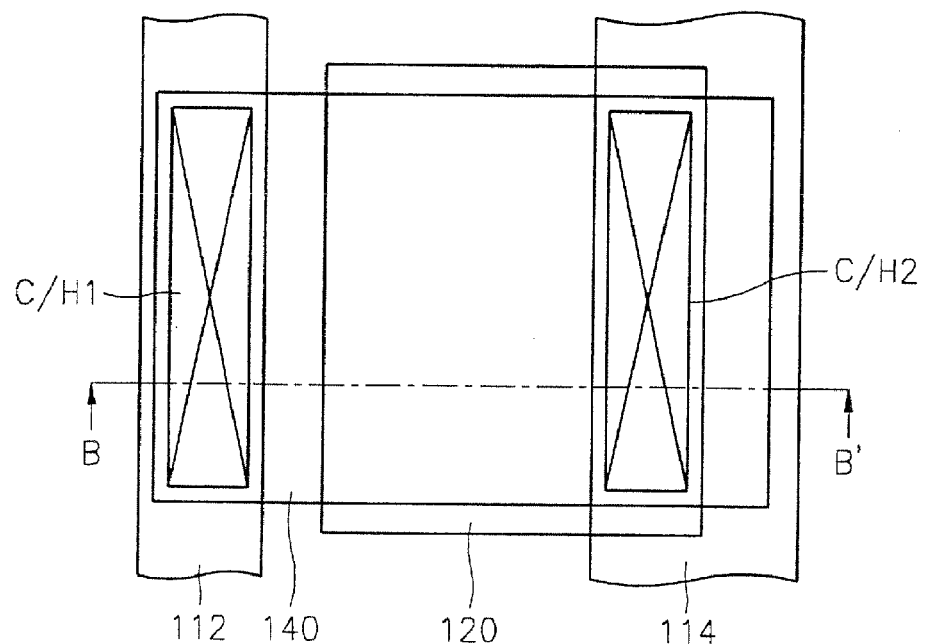
FIG. 8 is an example layout diagram for forming the MIM capacitor according to the schematic diagram of FIG. 3.

FIG. 8 is another example layout for forming the MIM capacitor according to the schematic diagram of FIG. 3. This layout is different from the layout illustrated in FIG. 4 in that a pattern for a contact hole C/H2, through which the top surface of a second wire layer 114 will be exposed, is further included.

Figure 9:
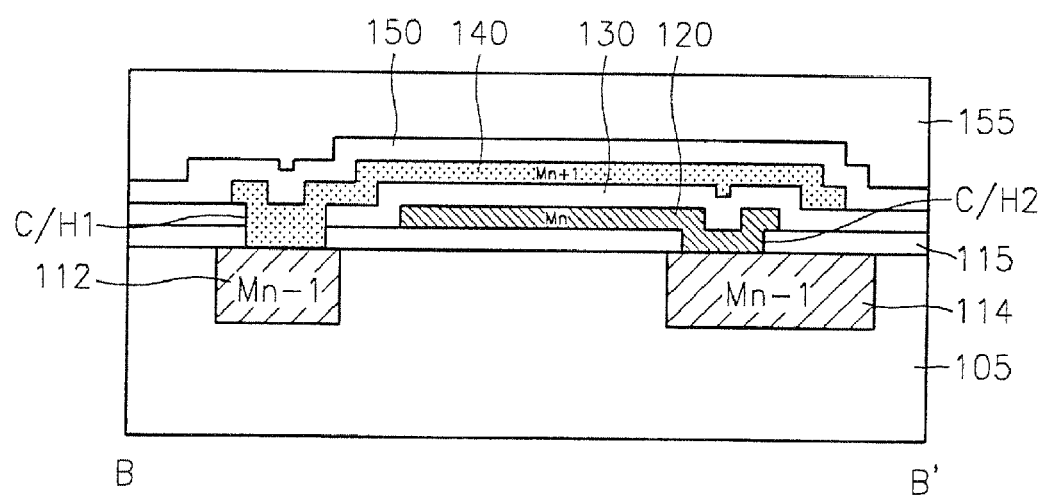
FIGS. 9-11 are cross-sectional diagrams of MIM capacitors formed according to the layout illustrated in FIG. 8.
Figure 10:
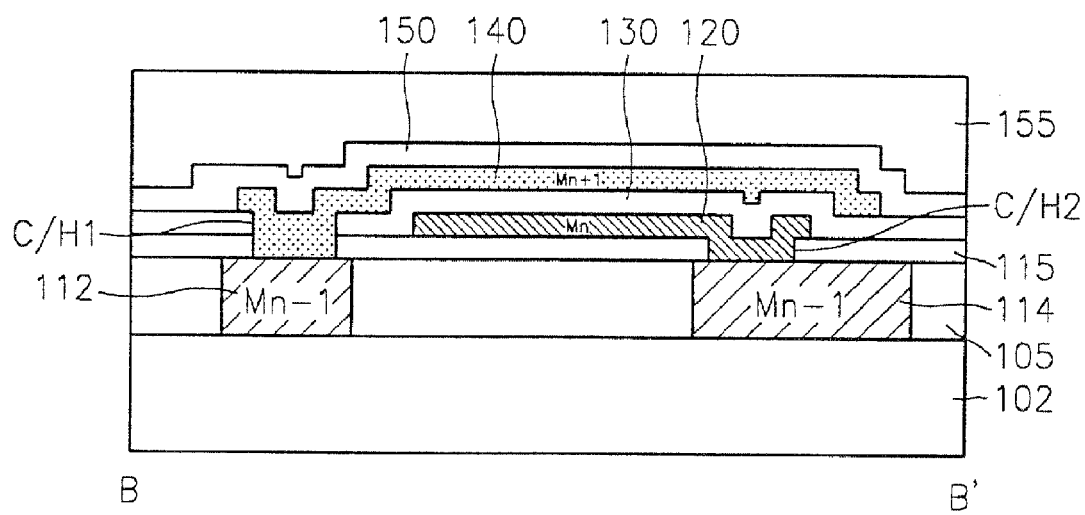
Figure 11:
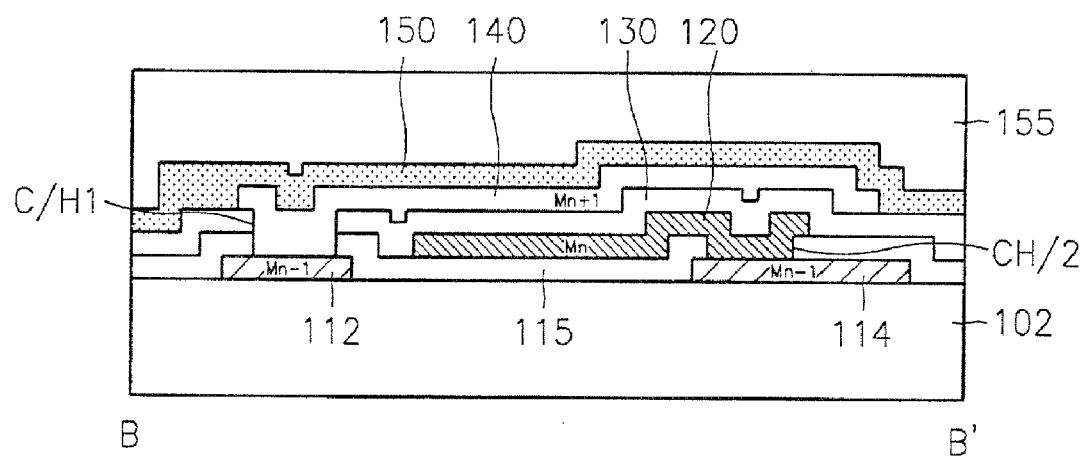

FIGS. 9 through 11 are cross-sectional diagrams of MIM capacitors according to the layout shown in FIG. 8, taken along line B-B' of FIG. 8.

Referring to FIG. 9, an upper interlayer dielectric layer 115 is formed on a lower interlayer dielectric layer 105, in which first and second wire layers 112 and 114 are embedded, and a lower electrode 120 is formed on the interlayer dielectric layer 115. The lower electrode 120 is the same as the corresponding element of FIG. 5 except that it is formed to directly contact the second wire layer 114 through the contact hole C/H2, which is formed in the upper interlayer dielectric layer 115. Additionally, an upper electrode 140 is formed to directly contact the first wire layer 112 through a contact hole C/H1 formed in a dielectric layer 130 and the upper interlayer dielectric layer 115. The contact hole C/H1 has a low aspect ratio since the contact hole C/H1 is formed in the dielectric layer 130 and the upper interlayer dielectric layer 115.

Referring to FIG. 10, CMP is performed on an interlayer dielectric layer 105 to make the top surfaces of first and second wire layers 112 and 114 be level with each other. As a result of the CMP, the first and second wire layers 112 and 114 are embedded in the interlayer dielectric layer 105.

An MIM capacitor shown in FIG. 11 is similar to the one shown in FIG. 9 except that an interlayer dielectric layer 115 is formed after patterning the first and second wire layers 112 and 114, without performing CMP.

Figure 12:
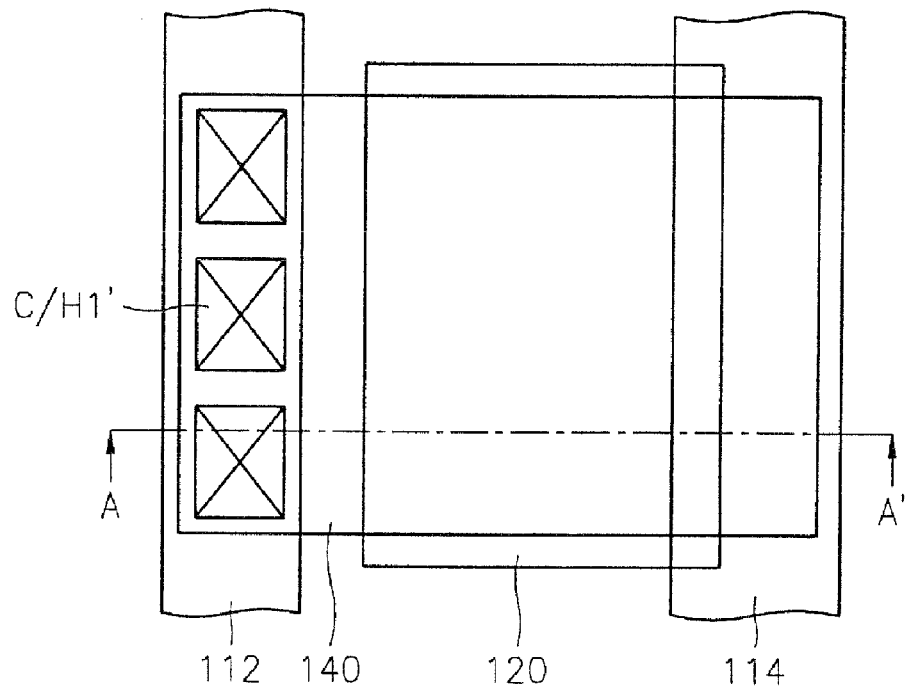
FIGS. 12-13 are additional example layout diagrams for forming the MIM capacitor according to the schematic diagram of FIG. 3.
Figure 13:
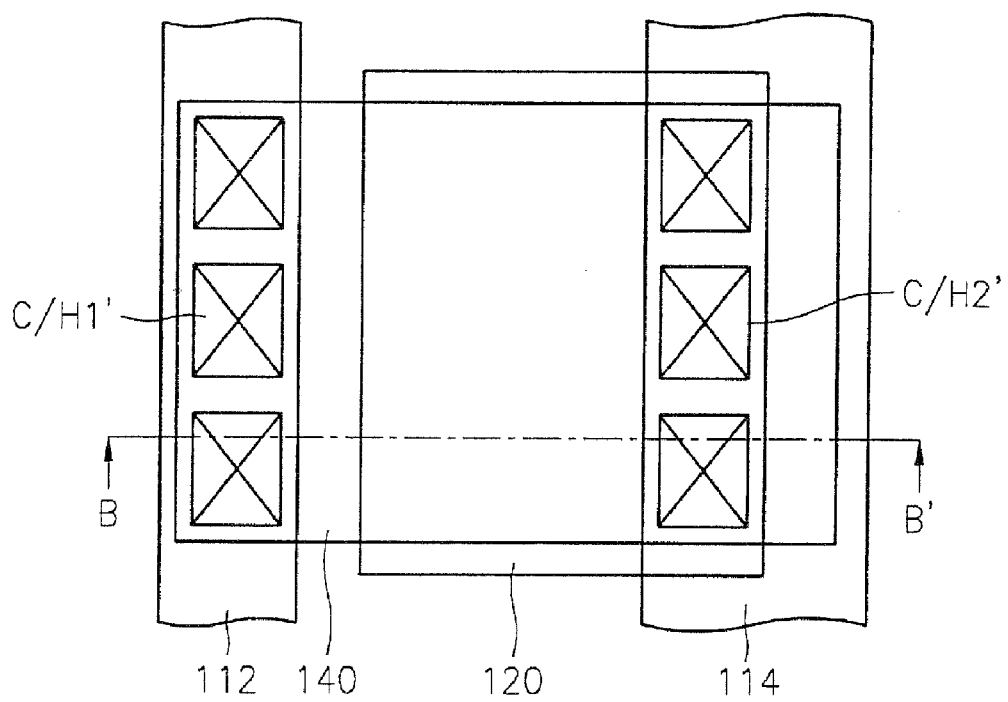

FIGS. 12 and 13 are further example layouts for forming the MIM capacitor according to the schematic diagram of FIG. 3. These layout diagrams are different from the layouts of FIGS. 4 and 8 in that patterns for contact holes C/H1' and C/H2' include a multitude of separate patterns.

Figure 14:
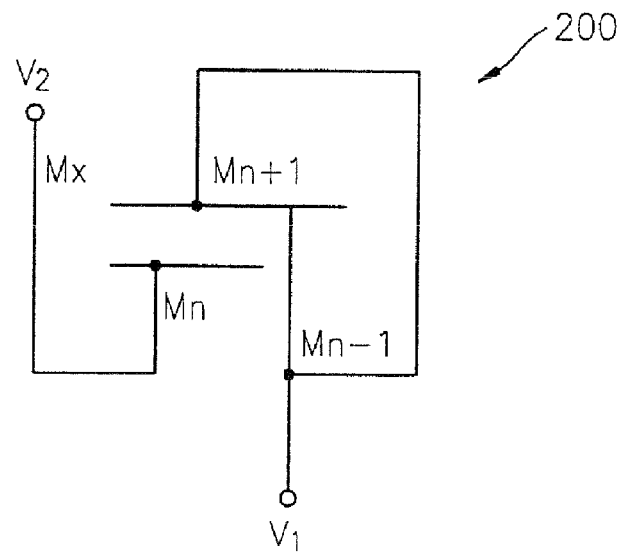
FIG. 14 is an equivalent schematic circuit diagram of an MIM capacitor according to another embodiment of the invention.

FIG. 14 is an equivalent circuit diagram of an MIM capacitor 200 according to another embodiment of the invention. The MIM capacitor 200 includes a lower electrode formed in the Mn level and an upper electrode formed in the Mn+1 level. A first voltage V1 is applied to the upper electrode via a wire layer formed in the Mn−1 level, which is lower than the level of the lower electrode. A second voltage V2 is applied to the lower electrode via a wire layer formed in a Mx level (here, x>n+1).

Figure 15:
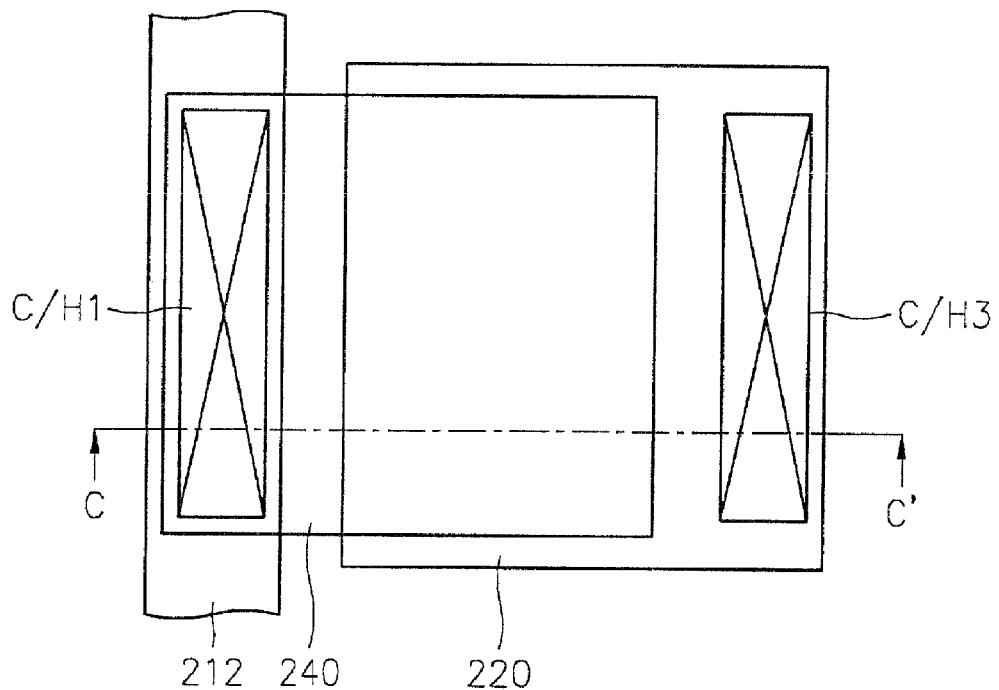
FIG. 15 is an example layout diagram for forming the MIM capacitor according to the schematic diagram of FIG. 14.
Figure 16:
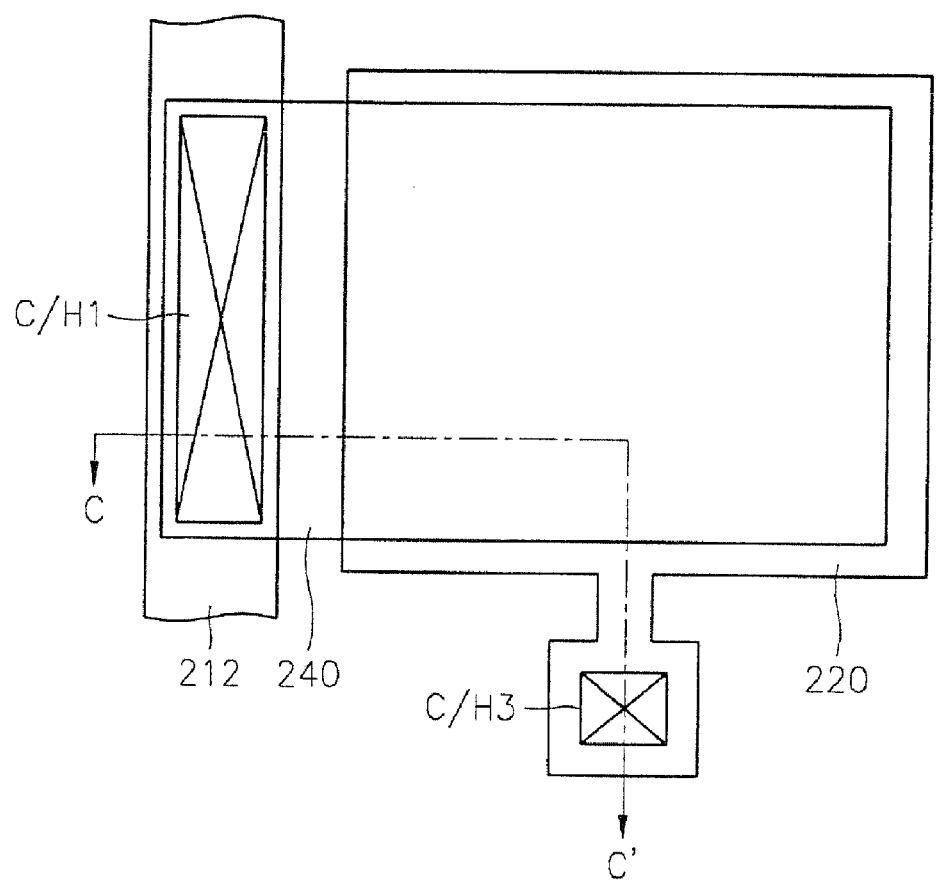
FIG. 16 is another example layout diagram for forming the MIM capacitor according to the schematic diagram of FIG. 14.

The MIM capacitor 200 according to this embodiment of the invention may be embodied using layouts such as example layout diagrams shown in FIGS. 15 and 16. Reference numerals 212, 220, and 240 represent a first wire layer pattern, a lower electrode pattern, and an upper electrode pattern, respectively. The first reference voltage V1 is applied to the wire layer pattern 212. Reference numerals C/H1 and C/H3 represent a contact hole pattern for exposing the first wire layer 212 and a contact hole pattern for exposing the lower electrode 220, respectively. The layout pattern of FIG. 16 maximizes the effective area of an MIM capacitor. In FIG. 16, the lower electrode pattern 220 has a protrusion along one edge and the contact hole pattern C/H3 is arranged in the protrusion. The contact hole patterns C/H2 and C/H3 may be substituted by a multitude of separated patterns, as was illustrated in FIGS. 12 and 13.

Figure 17:
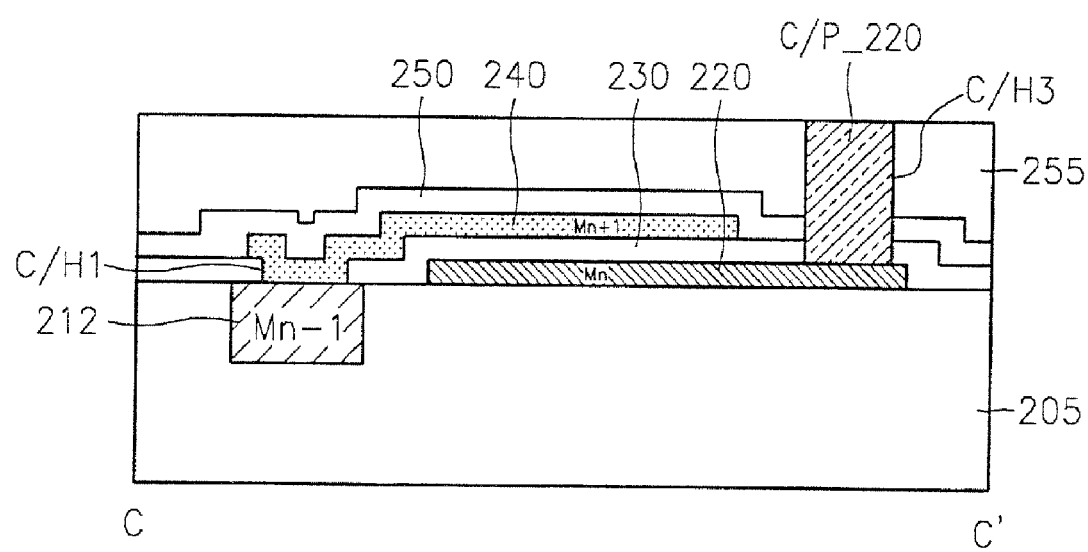
FIGS. 17-18 are cross-sectional diagrams of MIM capacitors formed according to the layout shown in FIG. 15.
Figure 18:
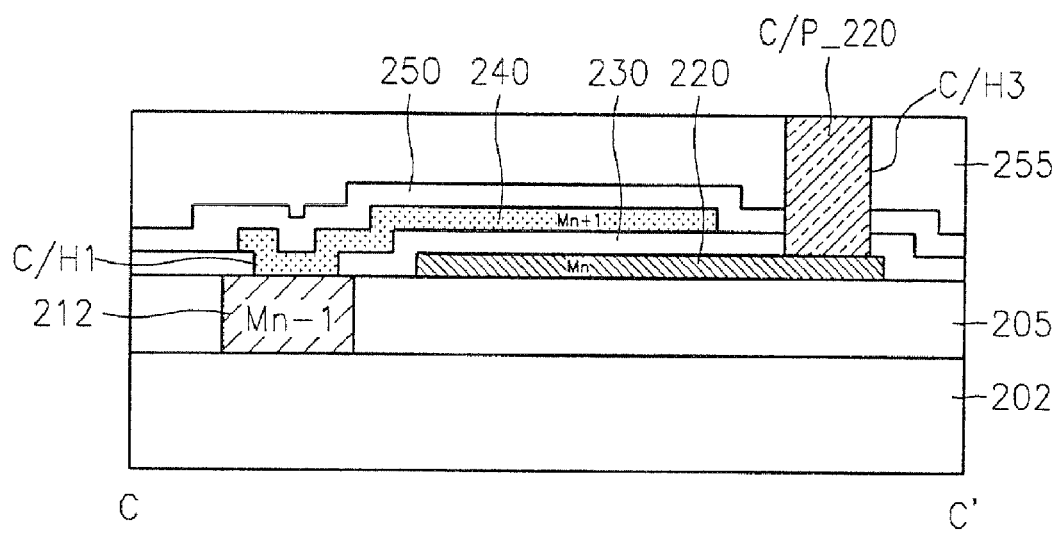
Figure 19:
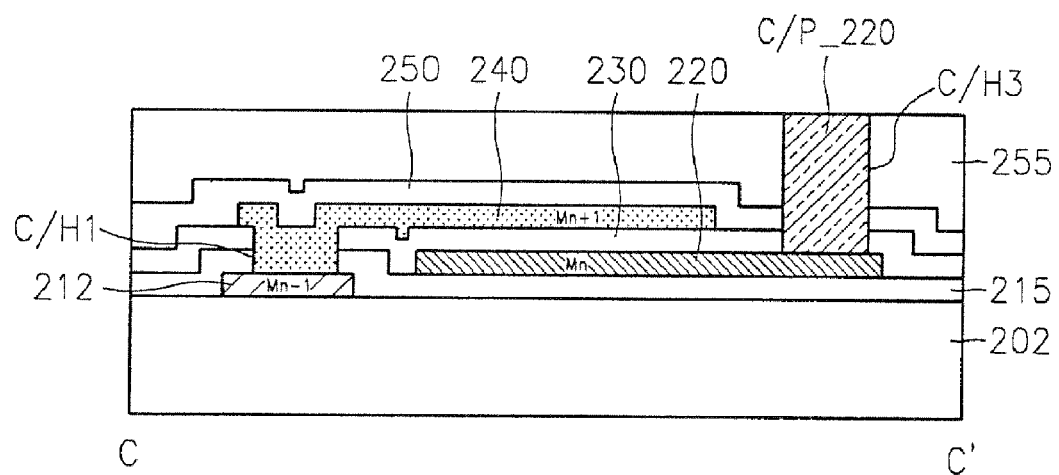
FIG. 19 is a cross-sectional diagram of a MIM capacitor formed according to the layout shown in FIG. 16.

The cross-sections of MIM capacitors formed using the layouts shown in FIG. 15 or 16 have different structures, as shown in FIGS. 17 through 19.

Referring to FIG. 17, an MIM capacitor has a structure where an upper electrode 240 is arranged to overlap a lower electrode 220, and a dielectric layer 230 is positioned between the upper and the lower electrodes 240 and 220. The upper electrode 240 contacts a first wire layer 212, to which the first voltage V1 is applied, via a contact hole C/H1 through which the top surface of the first wire layer 212 is exposed. The upper electrode 240 is formed of a conductive layer in the Mn+1 level, the first wire layer 212 is formed of a conductive layer in the Mn−1 level, and the lower electrode 220 is formed of a conductive layer in the Mn level. The lower electrode 220 contacts a second wire layer (not shown) in the Mx level (here, x>n+1), to which the second voltage V2 is applied, via a contact plug C/P_220 which fills a contact hole C/H3. The contact hole C/H3 is formed in upper interlayer dielectric layers 255 and 250 and a dielectric layer 230 so as to expose the top surface of the lower electrode 220. According to this embodiment of the present invention, even though the lower electrode 220 is connected to the second wire layer via the contact plug C/P_220, it is possible to form an MIM capacitor having a minimized thickness dielectric layer.

FIG. 18 shows the structure of an MIM capacitor, in which a first wire layer 212 is embedded in an interlayer dielectric layer 205 planarized by performing CMP. FIG. 19 shows the structure of another MIM capacitor in which a first wire layer 212 is isolated from a lower electrode 220 by forming another interlayer dielectric layer 215, after forming the first wire layer 212 on a lower interlayer dielectric layer 202. In the MIM capacitor illustrated in FIG. 19, no CMP process is performed.

Figure 20:
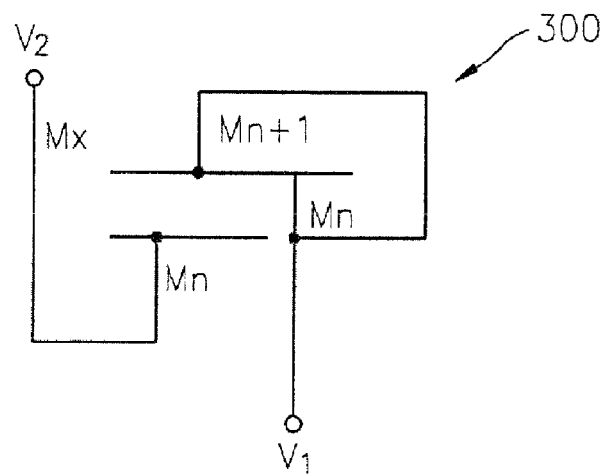
FIG. 20 is an equivalent schematic circuit diagram of an MIM capacitor according to yet another embodiment of the invention.
Figure 21:
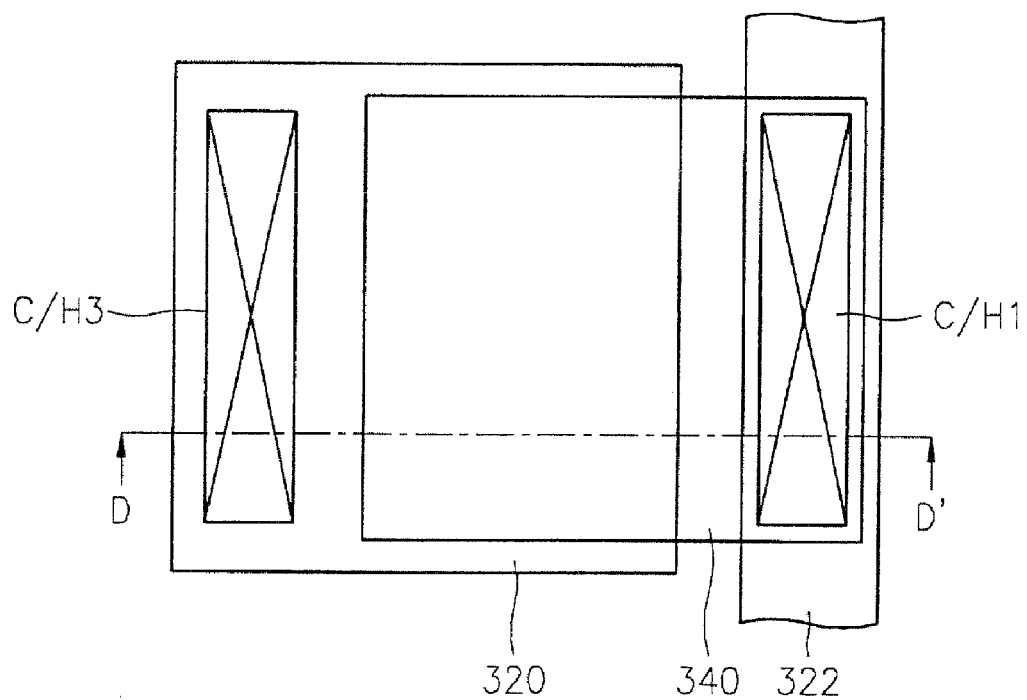
FIG. 21 is an example layout diagram for forming a MIM capacitor according to the schematic diagram of FIG. 20.
Figure 22:
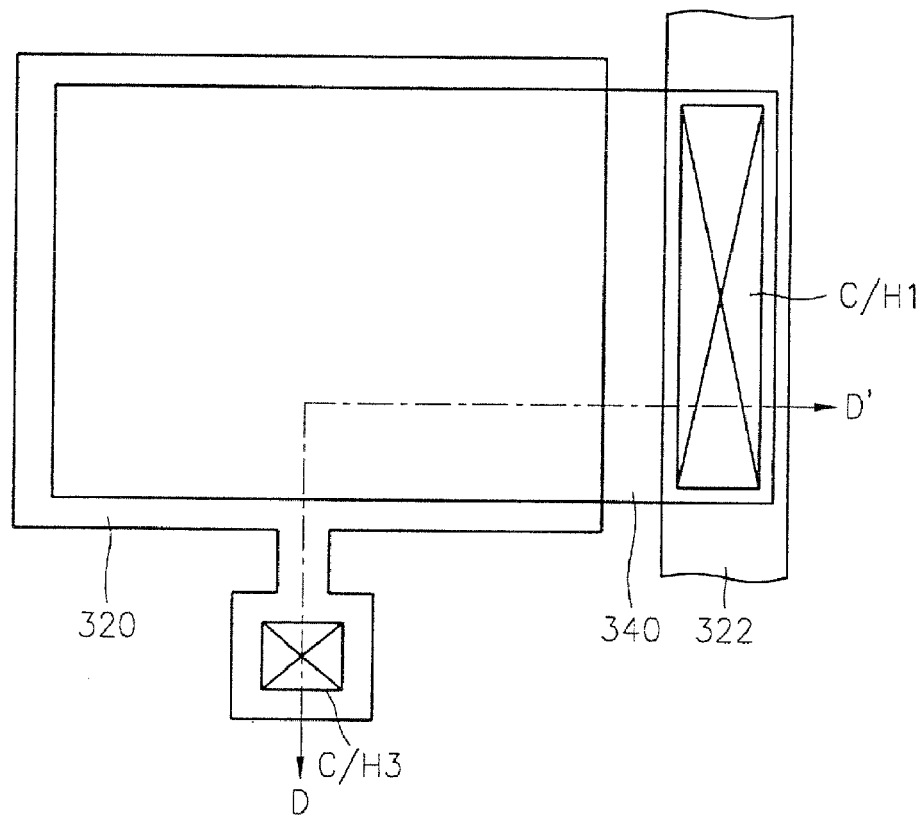
FIG. 22 is another example layout diagram for forming a MIM capacitor according to the schematic diagram of FIG. 20.

FIG. 20 is an equivalent circuit diagram of an MIM capacitor 300 according to yet another embodiment of the present invention. The MIM capacitor 300 includes a lower electrode formed in the Mn level and an upper electrode formed in the Mn+1 level. The first voltage V1 is applied to the upper electrode via a wire layer formed in the same level (Mn) as the lower electrode. The second voltage V2 is applied to the lower electrode of the Mn level via a wire layer formed in a Mx level (here, x>n+1). The MIM capacitor 300 according to this embodiment may be embodied using the layouts such as the example layouts shown in FIG. 21 or 22. In FIG. 21, reference numerals 320, 322, and 340 represent a lower electrode pattern, a first wire layer pattern, to which the first voltage V1 is applied, and an upper electrode pattern, respectively. Reference numerals C/H1 and C/H3 respectively represent a contact hole pattern through which a first wire layer 322 is exposed and a contact hole through which a lower electrode is exposed. FIG. 22 is an example layout diagram for forming an MIM capacitor so as to maximize the effective area of the MIM capacitor even more. The layout shown in FIG. 22 is the same as the one shown in FIG. 21 except that the lower electrode pattern 320 has a protrusion along one edge and the contact hole pattern C/H3 is arranged in the protrusion. As illustrated in FIGS. 12 and 13, the contact hole patterns C/H2 and C/H3 may be formed using several separated patterns.

Figure 23:
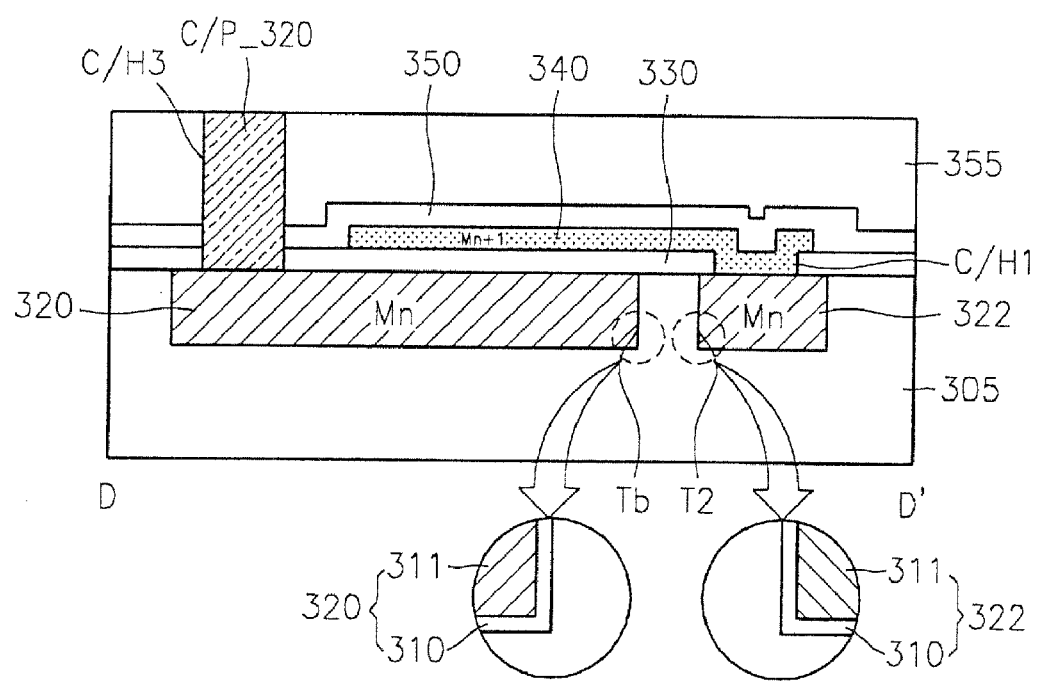
FIGS. 23-24 are cross-sectional diagrams of MIM capacitors formed according to the layout shown in FIG. 21.
Figure 24:
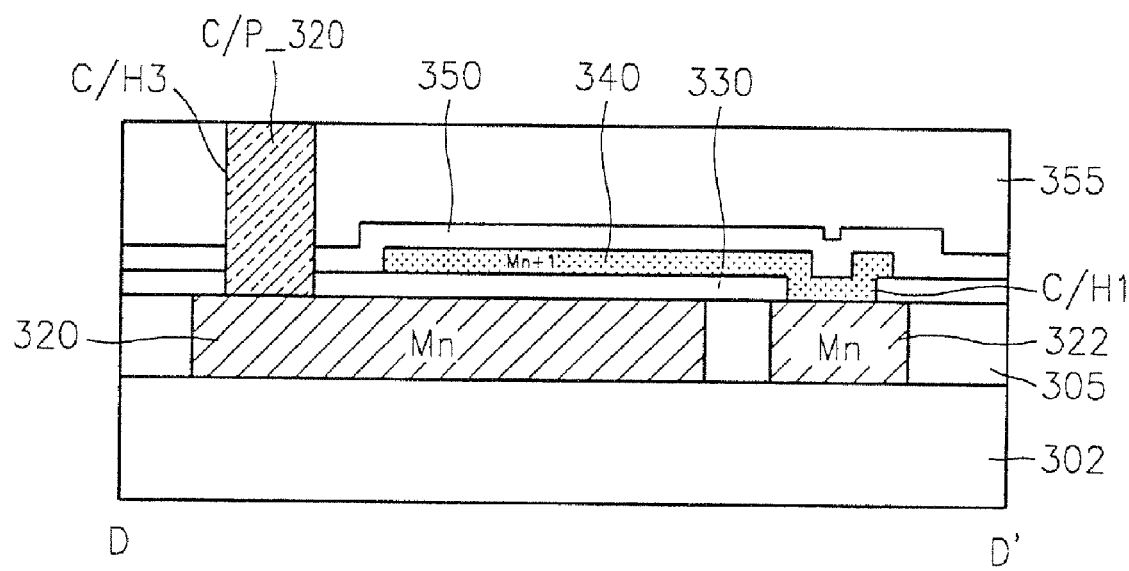
Figure 25:
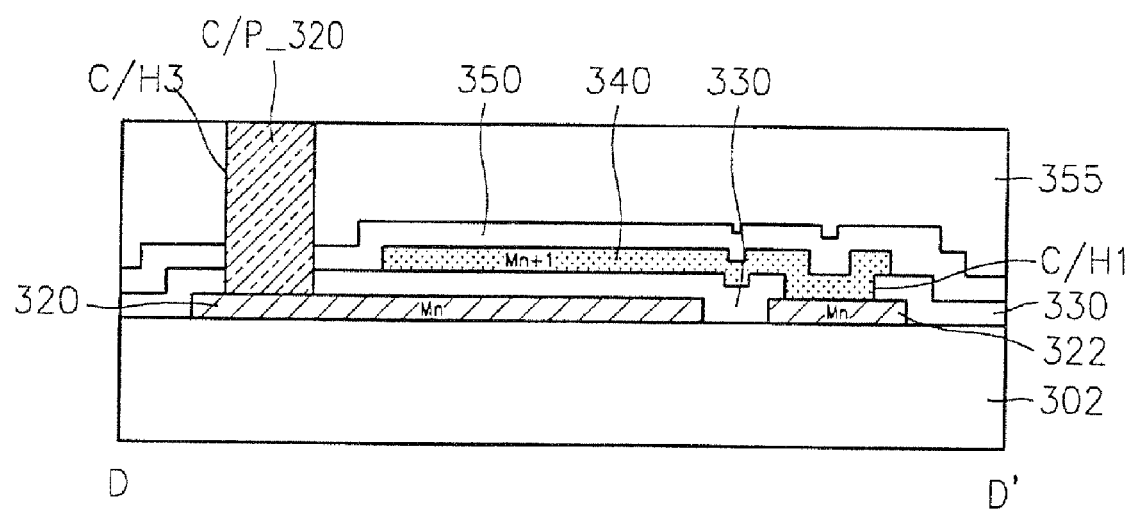
FIG. 25 is a cross-sectional diagram of a MIM capacitor formed according to the layout shown in FIG. 22.

The cross-sections of MIM capacitors embodied using the layouts shown in FIG. 21 or 22 may have different structures, as shown in FIGS. 23 through 25, which are cross-sectional diagrams of such MIM capacitors, taken along lines D-D' of FIGS. 21 and 22.

Referring to FIG. 23, an upper electrode 340 is arranged to overlap a lower electrode 320, and a dielectric layer 330 is positioned between the upper and lower electrodes 340 and 320. The upper electrode 340 contacts a first wire layer 322, to which the first voltage V1 is applied, through a contact hole C/H1 which is formed in the dielectric layer 330 to expose the first wire layer 322. The upper electrode 340 is formed of a conductive layer in the Mn+1 level, the first wire layer 322 is formed of a conductive layer in the Mn level, and the lower electrode 320 is formed of a conductive layer of the Mn level. A contact plug C/P_320 is formed to fill the contact hole C/H3 which is formed in interlayer dielectric layers 355 and 350 and through the dielectric layer 330 to expose the top surface of the lower electrode 320. The lower electrode 320 is connected to a second wire layer (not shown) in the Mx level (here, x>n+1). The second voltage V2 is applied to the lower electrode 320 by means of the contact plug C/P_320 which is formed within the contact hole C/H3.

In terms of minimizing a step difference, it is preferable that the top surfaces of the lower electrode 320 and the first wire layer 322 are level with each other. In FIG. 23, the lower electrode 320 and the first wire layer 322 are damascene wire layers which are formed by depositing a conductive layer in trenches Tb and T2, which are formed in a dielectric layer 305, and planarizing the conductive layer using CMP. The damascene wire layers include a barrier metal layer 310 formed at the inner walls and bottom of each of the trenches Tb and T2 and a planarized conductive layer 311 formed filling the trenches Tb and T2. Connections between the first wire layer 322 and other wire layers and processes for manufacturing wire layers in a level higher than the Mn+1 level may vary depending on the application.

An MIM capacitor shown in FIG. 24 is the same as the MIM capacitor shown in FIG. 23 except that a lower electrode 320 and a first wire layer 322 are located on a lower interlayer dielectric layer 302 and are embedded in an interlayer dielectric layer 305, which has been planarized by performing CMP.

Referring to FIG. 25, a lower electrode 320 and a first wire layer 322 are thinly formed on a lower interlayer dielectric layer 302. Thus, it is possible to make an MIM capacitor without performing a CMP process, if the lower electrode 320 and the first wire layer 322 can be electrically disconnected using only a dielectric layer 330.

Next, a method for manufacturing the MIM capacitor shown in FIG. 5 using the layout shown in FIG. 4, according to an embodiment of the invention will be described with reference to FIGS. 26 through 30.

Figure 26:
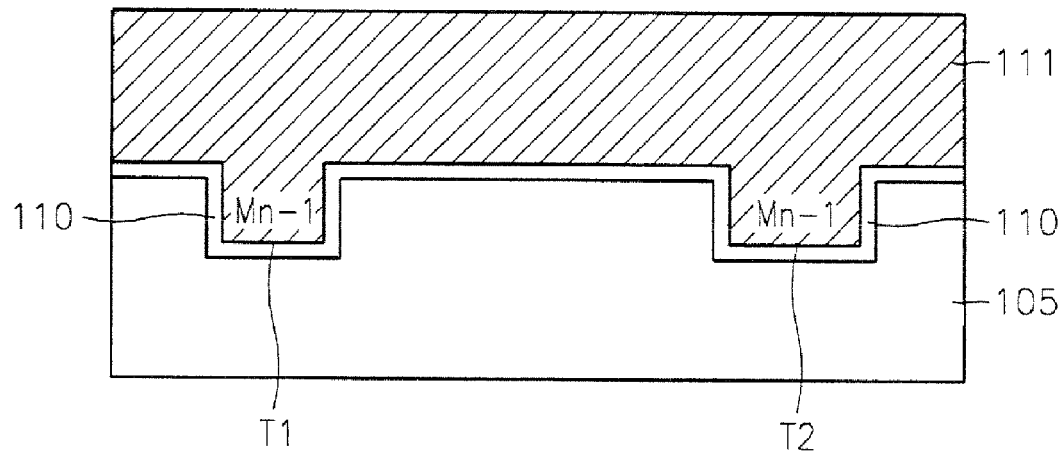
FIGS. 26-30 are cross-sectional diagrams illustrating a method for manufacturing a MIM capacitor shown in FIG. 5 according to an embodiment of the invention.

Referring to FIG. 26, trenches T1 and T2 are formed in an interlayer dielectric layer 105 on a substrate (not shown). A barrier layer 110 is formed at the inner walls and the bottom of the first and second trenches T1 and T2 that are formed in the dielectric layer 105. The barrier layer 110 may be formed of a transition metal layer, a transition metal alloy layer, or a transition metal compound layer, or any combination thereof. For example, the barrier layer 110 may be formed of a Ta layer, a TaN layer, a TaSiN layer, a TiN layer, a TiSiN layer, a WN layer, or a WSiN layer. The barrier layer 110 is introduced to prevent metal atoms of the metal layer filling the first and second trenches T1 and T2 from diffusing into the interlayer dielectric layer 105. Next, a conductive layer 111, for example, a metal layer, is formed on the barrier layer 110 to completely fill the first and second trenches T1 and T2.

The conductive layer 111 may be formed of any low-resistance material that is appropriate for a damascene processes. For example, the conductive layer 111 may be formed of a copper (Cu) layer. In particular, a copper seed layer is formed on the barrier layer 110 which is formed at the inner walls and the bottom of the trenches T1 and T2. Next, the conductive layer 111 comprised of a copper layer is formed on the copper seed layer to completely fill the trenches T1 and T2 using electroplating.

Figure 27:
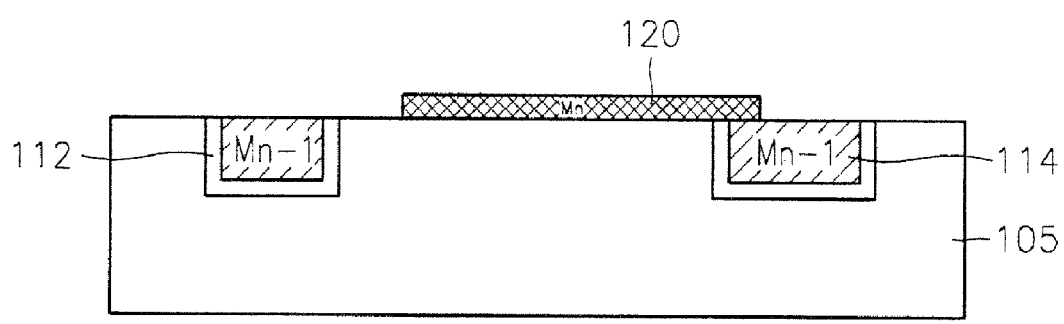

Thereafter, as shown in FIG. 27, the conductive layer 111 and the barrier layer 110 are planarized using CMP until the top surface of the interlayer dielectric layer 105 is exposed. As a result of the planarization, wire layers at a Mn−1 level, i.e., first and second wire layers 112 and 114, are formed without having a step difference.

Next, a conductive level at a Mn level is deposited on the entire surface of the substrate and is patterned using conventional photolithography so that a lower electrode 120 is formed to directly contact the second wire layer 114. The lower electrode 120 may be formed of a metal layer, a metal compound layer, or a combination thereof, for instance. For example, the lower electrode 120 may be formed of an Al layer, a Ta layer, a TaN layer, a TaSiN layer, a TiN layer, a TiSiN layer, a WN layer, a WSiN layer, or any combination thereof. Alternatively, the lower electrode 120 may be formed of a double layer of a Ta layer and a Cu layer, a double layer of a TaN layer and a Cu layer, a triple layer of a Ta layer, a TaN layer, and a Cu layer, or a triple layer of a TiN layer, a AlCu layer, and a TiN layer and so on.

Figure 28:
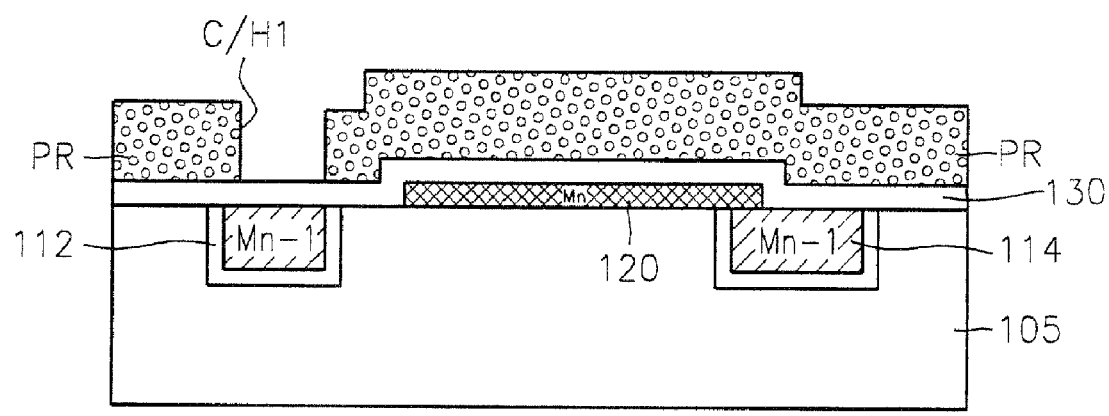

Next, as shown in FIG. 28, a dielectric layer 130 is formed on the entire surface of the substrate on which the lower electrode 120 is formed, and a photoresist pattern PR is formed on the dielectric layer 130 in order to define a contact hole C/H1 so that the first wiring layer on the dielectric layer 130 can be exposed through the contact hole C/H1. The dielectric layer 130 may be formed of any material as long as the dielectric constant of the material is high enough to enhance the capacitance of the eventual MIM capacitor. For example, the dielectric layer 130 may be formed of a SiO2 layer, a SixNy layer, a SixCy layer, a SixOyNz layer, a SixOyCz layer, an AlxOy layer, a HfxOy layer, or a TaxOy layer. If the lower electrode 120 is formed of a copper-based material, the dielectric layer 130 is preferably formed of a SixNy layer, a SixCy layer, a double layer of a SixNy layer and an oxide layer, or a double layer of a SixCy layer and an oxide layer. For example, the dielectric layer 130 may be formed of a double layer of a SixNy layer and a SixOyCz layer, a double layer of a SixNy layer and a TEOS layer, a double layer of SixNy layer and a PEOX layer, a double layer of SixCy layer and a SixOyCz layer, a double layer of a SixCy layer and a TEOS layer, or a double layer of a SixCy layer and a PEOX layer. It is possible to enhance the leakage-current characteristics of a capacitor by forming the dielectric layer 130 of a double layer of a SixNy layer and an oxide layer or a double layer of a SixCy layer and an oxide layer.

Figure 29:
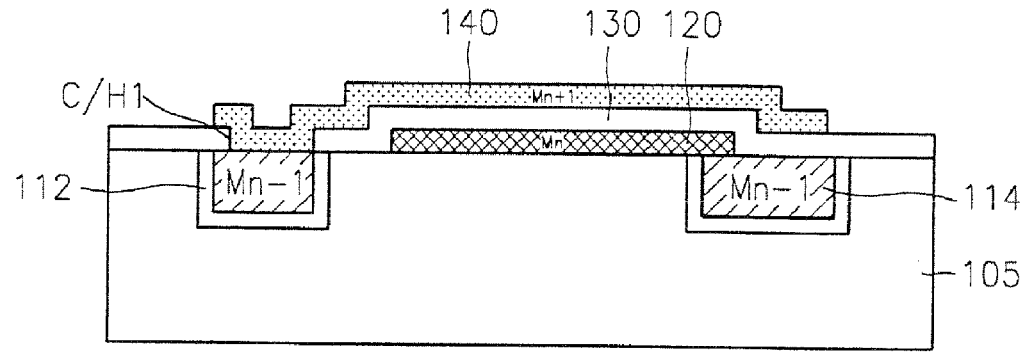

Next, as shown in FIG. 29, the dielectric layer 130 is etched using the photoresist pattern PR, thus completing the contact hole C/H1 through which the first wiring layer 112 is exposed. The photoresist pattern PR is removed by an ashing process and a wet removal process using a stripper. Thereafter, an Mn+1-level conductive layer is deposited on the entire surface of the substrate and patterned, thus completing an upper electrode 140 that contacts the first wiring layer 112 through the contact hole C/H1. The upper electrode 140 can be formed of any conductive material that can be used to form the lower electrode 120.

Figure 30:
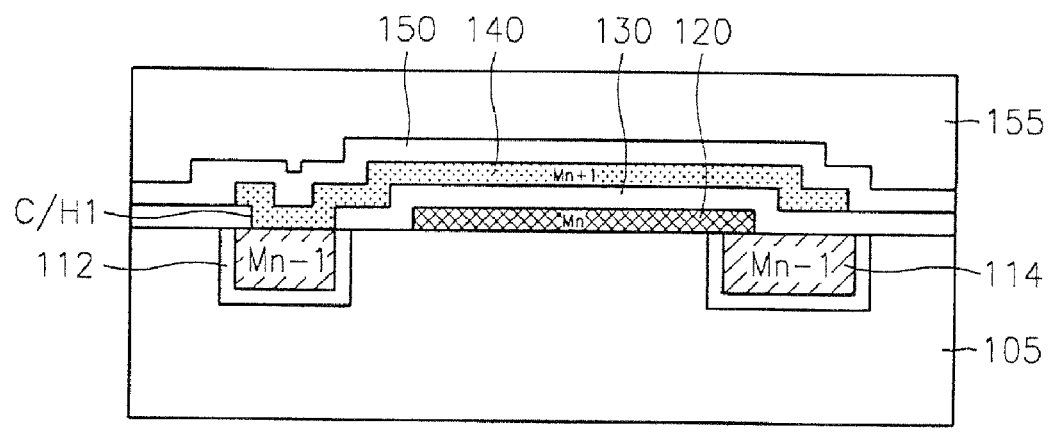

Next, as shown in FIG. 30, a capping layer 150 and an interlayer dielectric layer 155 are sequentially formed to protect the upper electrode 140. The capping layer 150 and the interlayer dielectric layer 155 may be formed of a TEOS layer, a PEOX layer, a SixOyCz layer, a SixOyFz layer, or a SixNy layer. Connections between the first and second wire layers 112 and 114 and other wire layers and processes of manufacturing wire layers in a level higher than the Mn+1 level may vary depending on the application.

With reference to FIGS. 31 through 34, a method for manufacturing the MIM capacitor shown in FIG. 5 according to another embodiment of the invention.

Figure 31:
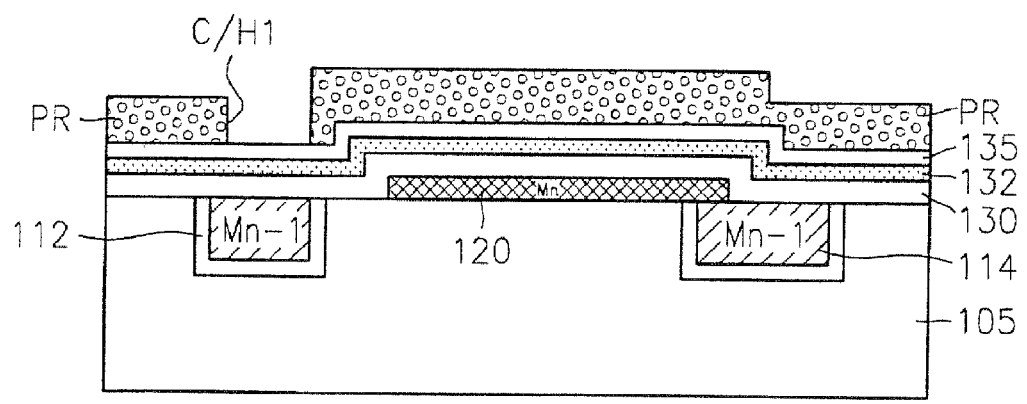
FIGS. 31-34 are cross-sectional diagrams illustrating another method for manufacturing a MIM capacitor shown in FIG. 5 according to another embodiment of the invention.

Referring to FIG. 31, the dielectric layer 130 is formed on the entire surface of the substrate on which the lower electrode 120 has already been formed. Thereafter, a dual hard mask (DHM) layer, which consists of a DHM lower layer 132 and a DHM upper layer 135, is formed on the dielectric layer 130. In terms of simplification of the entire process, it is preferable to form the DHM lower layer 132 of the same material that is used to form an upper electrode, which will be described in detail below. The DHM upper layer 135 is formed of a dielectric material to a predetermined thickness so that it can be removed together with the dielectric layer 130 in a subsequent etching process of forming the contact hole C/H1. The etching rate of the DHM upper layer 135 is similar or equal to that of the dielectric layer 130. Preferably, the DHM upper layer 135 is formed of the same material used to form the dielectric layer 130, and to the same thickness as that of the dielectric layer 130. Thereafter, the photoresist pattern PR is formed on the DHM upper layer 135 so that the contact hole C/H1, which will expose the first wiring layer 112, can be defined.

Figure 32:
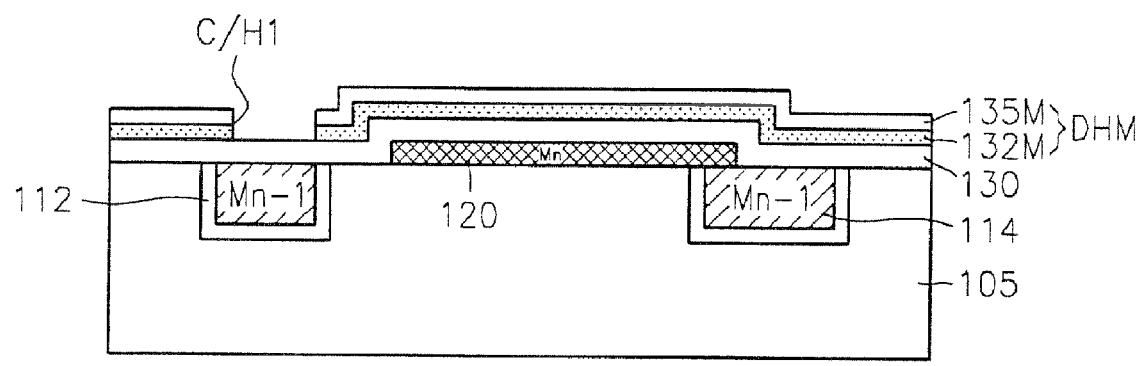

Referring to FIG. 32, the DHM upper and lower layers 135 and 132 are sequentially etched using the photoresist pattern PR as an etching mask, thus completing a DHM that defines the contact hole C/H1. Thereafter, the photoresist pattern PR is removed through ashing and wet removal processes using a stripper.

Figure 33:
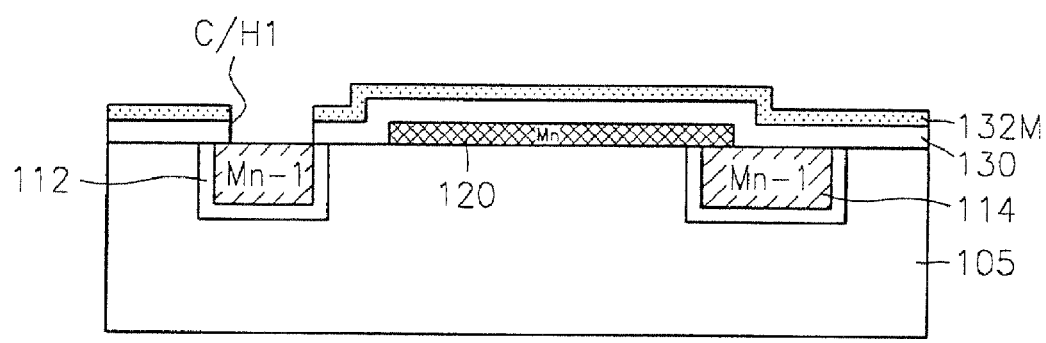

Referring to FIG. 33, the dielectric layer 130 is etched using the DHM as an etching mask, thus completing the contact hole C/H1 through which the first wiring layer 112 is exposed. During this process, process conditions, such as etching rates of the dielectric layer 130 and the DHM upper mask 135M, are appropriately adjusted so that the DHM upper mask 135M can be completely etched away during etching the dielectric layer 130. As a result of the etching, the contact hole C/H1 is completed. The DHM lower mask 132M still remains while the DHM upper mask 135M is completely removed. If the DHM upper mask 135M and the dielectric layer 130 are formed of the same material to the same thickness and then the entire surfaces of the DHM upper mask 135M and the dielectric layer 130 are etched back, the contact hole C/H1 can be more easily formed, and the DHM upper mask 135M can be more easily removed. As a result of the etch-back process, the surface of the DHM lower mask 132M is exposed.

Figure 34:
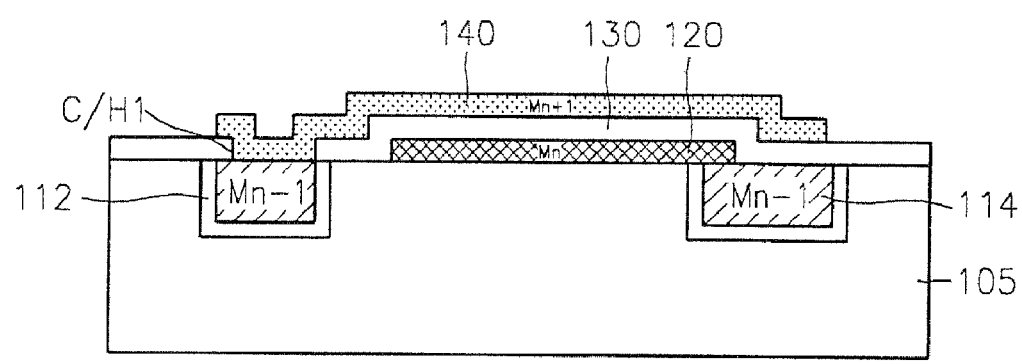

Referring to FIG. 34, in a case where the DHM lower mask 132M is formed of the same conductive material used for forming an upper electrode, there is no need to remove the DHM lower mask 132M. Accordingly, a conductive layer is formed to predetermined thickness in consideration of a desired final thickness of an upper electrode and the thickness of the DHM lower mask 132M. Thereafter, the conductive layer and the DHM lower mask 132M are patterned, thus forming an upper electrode 140. Subsequent processes are the same as their counterparts of the method of manufacturing an MIM capacitor according to the embodiment of the invention described above.

In the embodiment of the present invention described with reference to FIGS. 26-30, the surface of the dielectric layer 130 can be damaged and the first wiring layer exposed through the contact hole C/H1 can be undesirably oxidized due to oxygen (O2) plasma used in the process of ashing the photoresist pattern PR after formation of the contact hole C/H1 in the dielectric layer 130 through etching. On the contrary, in the embodiment of the invention described with reference to FIGS. 31-34, such damage to the dielectric layer 130 and such oxidization can be effectively prevented. More specifically, the photoresist pattern PR can be removed by an ashing process using oxygen (O2) plasma before the contact hole C/H1 is formed in the dielectric layer 130. Thereafter, the contact hole C/H1 is formed in the dielectric layer 130 using the DHM as an etching mask. Therefore, it is possible to prevent damage to the surface of the dielectric layer 130 and oxidation of the first wiring layer 112 exposed through the contact hole C/H1 from occurring due to oxygen plasma.

With reference to FIGS. 35-38 a method for manufacturing an MIM capacitor of FIG. 5 will be described in accordance with another embodiment of the invention. This embodiment differs from that described above in that a DHM is formed to have a deposited structure of dielectric layers.

Figure 35:
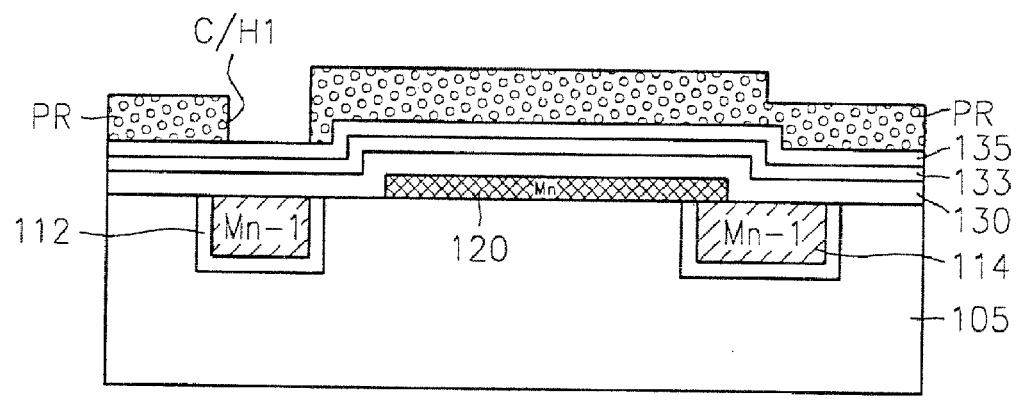
FIGS. 35-38 are cross-sectional diagrams illustrating a method for manufacturing a MIM capacitor shown in FIG. 5 according to yet another embodiment of the invention.

Referring to FIG. 35, a DHM layer, which includes a DHM lower layer 133 and a DHM upper layer 135, is formed after the dielectric layer 130 is formed on the entire surface of the substrate, on which the lower electrode 120 has already been formed. The DHM lower layer 133 is formed of a material having a higher etching selectivity to the dielectric layer 130. For example, if the dielectric layer 130 is formed of an oxide layer, the DHM lower layer 133 is formed of a nitride layer. Alternatively, if the dielectric layer 130 is formed of a nitride layer, the DHM lower layer 133 is formed of an oxide layer. The DHM upper layer 135 could also be formed of a dielectric layer. Preferably, the DHM upper layer 135 and the dielectric layer 130 are formed of the same material to the same thickness. Thereafter, the photoresist pattern PR is formed on the DHM upper layer 135 so that the contact hole C/H1, through which the first wiring layer 112 will be exposed, can be defined.

Figure 36:
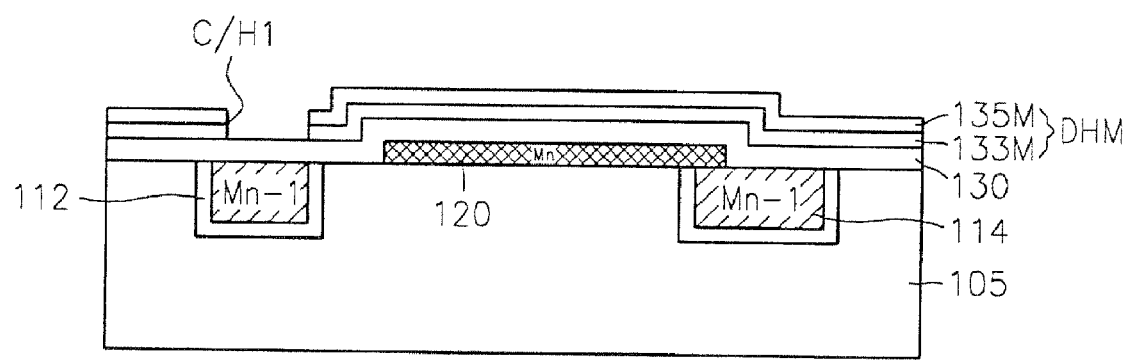

Referring to FIG. 36, the DHM upper and lower layers 135 and 133 are sequentially etched using the photoresist pattern PR as an etching mask, thus completing a DHM that defines the contact hole C/H1. Thereafter, the photoresist pattern PR is removed by ashing and wet removal processes using a stripper.

Figure 37:
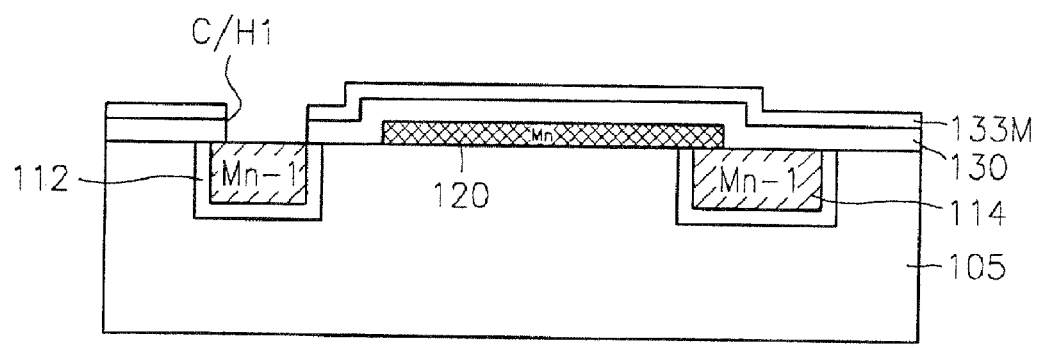

Referring to FIG. 37, the dielectric layer 130 is etched using the DHM as an etching mask, thus completing the contact hole C/H1, through which the first wiring layer 112 is exposed. During this process, process conditions, such as etching rates of the dielectric layer 130 and the DHM upper mask 135M, are appropriately adjusted so that the DHM upper mask 135M can be completely etched away during etching the dielectric layer 130 to complete the contact hole C/H1. If the DHM upper mask 135M and the dielectric layer 130 are formed of the same material and have the same thickness, then the entire surfaces of the DHM upper mask 135M and the dielectric layer 130 are etched back. In this way, the contact hole C/H1 can be more easily formed, and the DHM upper mask 135M can be more easily removed. As a result of the etch-back process, the surface of the DHM lower mask 132M is exposed.

Figure 38:
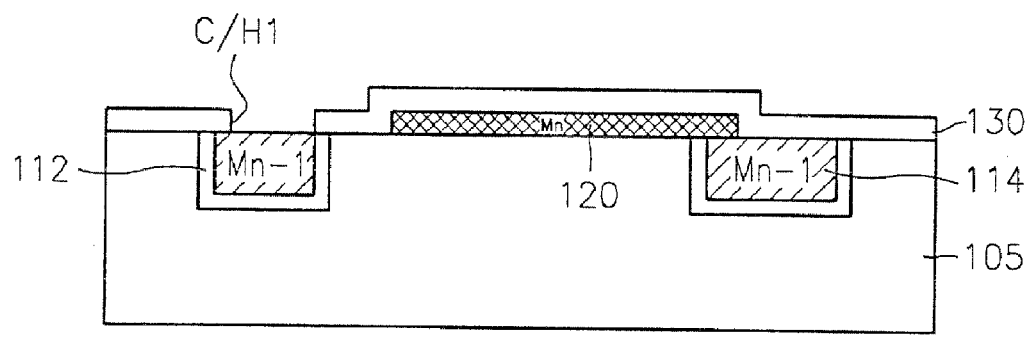

Referring to FIG. 38, the surface of the dielectric layer 130 is exposed by removing the DHM lower mask 133M. The DHM lower mask 133M is removed by etching back the DHM lower mask 133M with a maximum wet etching selectivity of the dielectric layer 130 with respect to the DHM lower mask 133M. As a result of the etch-back process, the dielectric layer 130 having the contact hole C/H1 is exposed, and through the contact hole C/H1, the first wiring layer 112 is exposed.

Subsequent processes, which are the same as their counterparts of the other embodiments for manufacturing an MIM capacitor, described above, are carried out, thus completing an MIM capacitor.

In this embodiment, like in embodiments described with reference to FIGS. 31-34, the surface of the dielectric layer 130 and the first wiring layer 112 is not exposed to oxygen plasma used in the ashing process for removing the photoresist pattern PR. Therefore, the surface of the dielectric layer 130 and the first wiring layer 112 can be prevented from being damaged or oxidized by the oxygen plasma.

Figure 39:
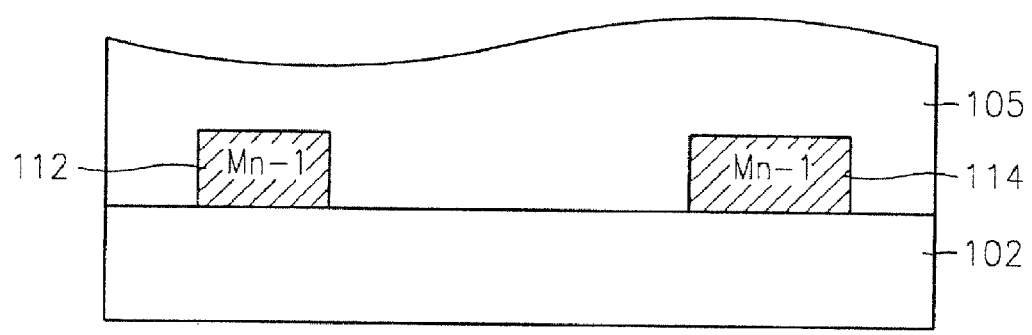
FIGS. 39-40 are a cross-sectional diagram illustrating a method for manufacturing a MIM capacitor shown in FIG. 6.
Figure 40:
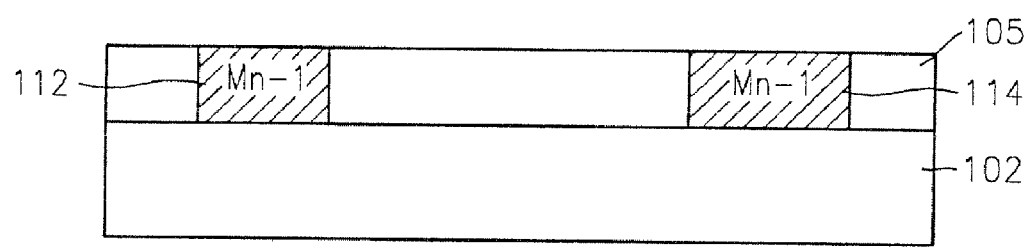

FIGS. 39 and 40 are cross-sectional views illustrating portions of a method of manufacturing the MIM capacitor shown in FIG. 6 using the layout shown in FIG. 4.

As shown in FIG. 39, a conductive layer in a Mn−1 level is formed on a lower interlayer dielectric layer 102 and is patterned using conventional photolithography, thus forming first and second wire layers 112 and 114. An interlayer dielectric layer 105 is formed having a predetermined thickness so that the first and second wire layers 112 and 114 can be isolated from each other.

As shown in FIG. 40, a CMP process is performed on the interlayer dielectric layer 105 so that it can be level with the top surfaces of the first and second wire layers 112 and 114.

As a result of the CMP process, the first and second wire layers 112 and 114 are electrically isolated and planarized. Subsequent processes are the same or similar as the methods described above with reference to FIGS. 27 through 38

Figure 41:
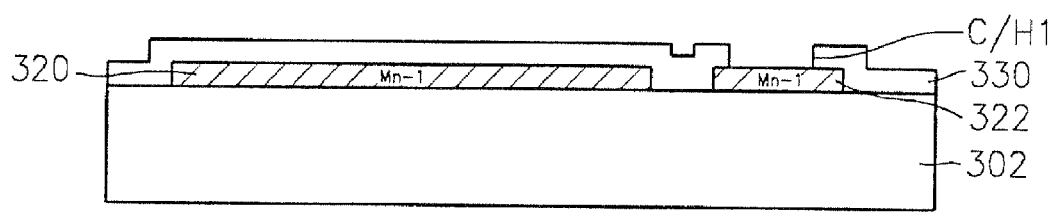
FIG. 41 is a cross-sectional diagram for illustrating a method for manufacturing the MIM capacitor shown in FIG. 25.

Next, portions of a method for manufacturing a portion of the MIM capacitor as illustrated in FIG. 25 will be described with reference to FIG. 41.

A conductive layer in a Mn level is formed on a lower interlayer dielectric layer 302 and is patterned using conventional photolithography, thus forming a lower electrode 320 and a first wire layer 322. Next, a dielectric layer 330 is deposited and a contact hole C/H1 is formed as described above with reference to the embodiments of the invention illustrated in FIGS. 27 through 38, through which the first wire layer 322 is exposed. Subsequent processes may be performed using methods which are well known to the one in the art, and/or as those described herein, thus forming an MIM capacitor having the cross-section shown in FIG. 25.

Those skilled in the art recognize that the MIM capacitor described herein can be implemented in many different variations. Therefore, although various embodiments are specifically illustrated and described herein, it will be appreciated that modifications and variations of the present invention are covered by the above teachings and within the purview of the appending claims without departing from the spirit and intended scope of the invention.

What is claimed is:

1. A method of forming an MIM capacitor, comprising:
   forming a lower electrode and a first wiring layer on a substrate;
   forming a dielectric layer on the resulting substrate;
   patterning an etching mask that is disposed on the dielectric layer;
   etching the dielectric layer through the etching mask to form a contact hole;
   removing the etching mask;
   forming an upper electrode that is disposed over the dielectric layer; and
   forming a contact through the contact hole between the first wiring layer and an underside of the upper electrode.

2. The method of claim 1 wherein forming an upper electrode and forming a contact occur simultaneously.

3. The method of claim 1 wherein patterning an etching mask comprises:
   forming a DHM layer; and
   patterning the DHM layer.

4. The method of claim 3 wherein forming a DHM layer comprises:
   forming a DHM lower layer; and
   forming a DHM upper layer of the same material used to form the dielectric layer.

5. The method of claim 4 wherein forming a DHM upper layer comprises:
   forming a DHM upper layer of the same material used to form the dielectric layer to a thickness approximately equal to that of the dielectric layer.

6. The method of claim 4 wherein forming a DHM lower layer comprises:
   forming a DHM lower layer that is etch-selectable from the dielectric layer.

7. The method of claim 4 wherein forming a DHM lower layer comprises:
   forming a DHM lower layer of a same material used to form the upper electrode.

8. The method of claim 1, wherein the MIM capacitor includes the upper electrode, the dielectric layer and the lower electrode.

9. The method of claim 1, wherein forming an upper electrode comprises forming an upper electrode after etching the dielectric layer to form a contact hole.

10. A method of forming an MIM capacitor, comprising:
   forming a lower electrode and a first wiring layer on a substrate;
   forming a dielectric layer on the resulting substrate;
   forming a DHM layer on the dielectric layer;
   patterning the DHM layer;
   etching the dielectric layer through the patterned DHM layer to form a contact hole;
   removing at least one of the DHM layers;
   forming an upper electrode that is disposed over the dielectric layer; and
   forming a contact through the contact hole between the first wiring layer and an underside of the upper electrode.

11. The method of claim 10 wherein forming a DHM layer comprises:
   forming a lower DHM layer; and
   forming an upper DHM layer of a same material as used to form the dielectric layer.

12. The method of claim 11 wherein forming an upper DHM layer comprises forming an upper DHM layer of a same material as used to form the dielectric layer to a same thickness as the dielectric layer.

13. The method of claim 11 wherein forming a lower DHM layer comprises:
   forming a layer that has a different etching rate than the dielectric layer.

14. The method of claim 11 wherein forming a lower DHM layer comprises:
   forming a layer of a same material as used to form the upper electrode.

* * * * *

UNITED STATES PATENT AND TRADEMARK OFFICE
CERTIFICATE OF CORRECTION

PATENT NO. : 7,560,332 B2 Page 1 of 1
APPLICATION NO. : 11/733711
DATED : July 14, 2009
INVENTOR(S) : Kyoung-Woo Lee et al.

It is certified that error appears in the above-identified patent and that said Letters Patent is hereby corrected as shown below:

Column 7, line 49, the word "laver" should read -- layer --.

Signed and Sealed this

Twenty-second Day of September, 2009

David J. Kappos
*Director of the United States Patent and Trademark Office*